(12) United States Patent
Nagarkatti et al.

(10) Patent No.: US 8,912,835 B2
(45) Date of Patent: Dec. 16, 2014

(54) METHOD AND SYSTEM FOR CONTROLLING RADIO FREQUENCY POWER

(71) Applicant: MKS Instruments, Inc., Andover, MA (US)

(72) Inventors: Siddarth Nagarkatti, Acton, MA (US); Feng Tian, Woburn, MA (US); David Lam, Burlington, MA (US); Abdul Rashid, Salem, NH (US); Souheil Benzerrouk, Lowell, MA (US); Ilya Bystryak, Salem, MA (US); David Menzer, Boxford, MA (US); Jack J. Schuss, Newton, MA (US); Jesse E. Ambrosina, Topsfield, MA (US)

(73) Assignee: MKS Instruments Inc., Andover, MA (US)

( * ) Notice: Subject to any disclaimer, the term of this patent is extended or adjusted under 35 U.S.C. 154(b) by 0 days.

(21) Appl. No.: 14/151,321

(22) Filed: Jan. 9, 2014

(65) Prior Publication Data

US 2014/0306742 A1 Oct. 16, 2014

Related U.S. Application Data

(62) Division of application No. 12/491,538, filed on Jun. 25, 2009, now Pat. No. 8,659,335.

(51) Int. Cl.
*H03K 3/00* (2006.01)
*H03K 5/01* (2006.01)

(52) U.S. Cl.
CPC ......................................... *H03K 5/01* (2013.01)

USPC ........ 327/181; 315/111.21; 327/178; 438/714

(58) Field of Classification Search
USPC ............. 315/111.21; 327/164, 172, 178–181; 438/710, 714
See application file for complete search history.

(56) References Cited

U.S. PATENT DOCUMENTS 4,357,195 A 11/1982 Gorin
4,629,940 A 12/1986 Gagne et al.
(Continued)

FOREIGN PATENT DOCUMENTS

CN 1374809 A 10/2002
WO 9619028 A1 6/1996
(Continued)

OTHER PUBLICATIONS

Blauw et al., "Ion energy selection with pulsed-shaped RF-bias," XXVIIth ICPIG, (Jul. 18-22, 2005) Topic # 9.
(Continued)

*Primary Examiner* — William Hernandez
(74) *Attorney, Agent, or Firm* — Proskauer Rose LLP

(57) ABSTRACT

A method for controlling pulsed power that includes measuring a first pulse of power from a power amplifier to obtain data. The method also includes generating a first signal to adjust a second pulse of delivered power, the first signal correlated to the data to minimize a power difference between a power set point and a substantially stable portion of the second pulse. The method also includes generating a second signal to adjust the second pulse of delivered power, the second signal correlated to the data to minimize an amplitude difference between a peak of the second pulse and the substantially stable portion of the second pulse.

10 Claims, 10 Drawing Sheets

(56) References Cited

U.S. PATENT DOCUMENTS

| | | | |
|---|---|---|---|
| 4,935,661 A | 6/1990 | Heinecke et al. | |
| 5,118,997 A | 6/1992 | El-Hamamsy | |
| 5,859,501 A | 1/1999 | Chi | |
| 5,985,375 A | 11/1999 | Donohoe et al. | |
| 6,151,346 A | 11/2000 | Partlo et al. | |
| 6,201,208 B1 | 3/2001 | Wendt et al. | |
| 6,255,635 B1* | 7/2001 | Thompson et al. | 219/663 |
| 6,395,641 B2 | 5/2002 | Savas | |
| 6,472,822 B1 | 10/2002 | Chen et al. | |
| 6,566,272 B2 | 5/2003 | Paterson et al. | |
| 6,673,724 B2 | 1/2004 | Forster et al. | |
| 6,791,274 B1 | 9/2004 | Hauer et al. | |
| 6,818,562 B2 | 11/2004 | Todorow et al. | |
| 7,087,912 B2 | 8/2006 | Hamamoto | |
| 7,115,185 B1 | 10/2006 | Gonzalez et al. | |
| 7,144,521 B2 | 12/2006 | Rusu et al. | |
| 7,166,233 B2 | 1/2007 | Johnson et al. | |
| 7,169,256 B2 | 1/2007 | Dhindsa et al. | |
| 7,214,628 B2 | 5/2007 | Chua | |
| 7,304,438 B2 | 12/2007 | Kishinevsky | |
| 7,795,817 B2 | 9/2010 | Nitschke | |
| 7,981,306 B2 | 7/2011 | Blattner et al. | |
| 8,704,607 B2* | 4/2014 | Yuzurihara et al. | 332/149 |
| 8,773,019 B2* | 7/2014 | Coumou et al. | 315/111.21 |
| 2002/0068464 A1 | 6/2002 | Forster et al. | |
| 2007/0075654 A1 | 4/2007 | Kishinevsky | |
| 2007/0098893 A1 | 5/2007 | Stowell | |
| 2007/0098916 A1 | 5/2007 | Stowell | |
| 2007/0139122 A1 | 6/2007 | Nagarkatti et al. | |
| 2008/0179948 A1 | 7/2008 | Nagarkatti et al. | |
| 2009/0267669 A1* | 10/2009 | Kasai | 327/164 |

FOREIGN PATENT DOCUMENTS

| | | |
|---|---|---|
| WO | 2004102638 A2 | 11/2004 |
| WO | 2006091499 A2 | 8/2006 |
| WO | 2006133204 A2 | 12/2006 |
| WO | 2008085504 A2 | 7/2008 |

OTHER PUBLICATIONS

Dubost et al. "Low temperature pulsed etching of large glass substrates," J. Vac. Sci. Tech., A21(4) (Jul./Aug. 2003), pp. 892-894.

Jung et al. "Advanced plasma technology in microelectronics," Thin Solid Films, 341 (1999), pp. 112-119.

Hershkowitz et al., "Elimination of notching and ARDE by simultaneous modulation of source and wafer RF," IEEE International Conference on Plasma Science 1999 (ICOPS 99 IEEE Conference Record—Abstracts, p. 127).

Hershkowitz, "Role of Plasma-Aided Manufacturing in Semiconductor Fabrication," IEEE Transactions on Plasma Science, vol. 26(6) (Dec. 1998), pp. 1610-1620.

Ogata et al., "A New Microwave Plasma Etching System Using Time Modulation Bias Technology," Hitachi Review, vol. 48(6) (1999), pp. 344-348.

Schaepkens et al., "Effects of radio frequency bias frequency and radio frequency bias pulsing on SiO2 feature etching in IC fluorocarbon plasmas," J. Vac. Sci. Tech. B18(2), (Mar./Apr. 2000) pp. 856-863.

Seo et al., "Experimental Investigations of Pulse-Power-Modulated Inductive Discharges," J. Korean Phys. Soc., vol. 48(3) (Mar. 2006), pp. 414-421.

Vincent et al., "Optimal Pulse Shaping for Plasma Processing," IEEE Transactions on Control Systems Technology, vol. 12(1) (Jan. 2004), pp. 75-86.

Plasma Processing Powerpoint Presentation (Oct. 1997), 17 pages, [retrieved on Nov. 16, 2009]. Retrieved from the Internet <http://www.utdallas.edu/~overzet/Puls_97/sld002.htm>.

* cited by examiner

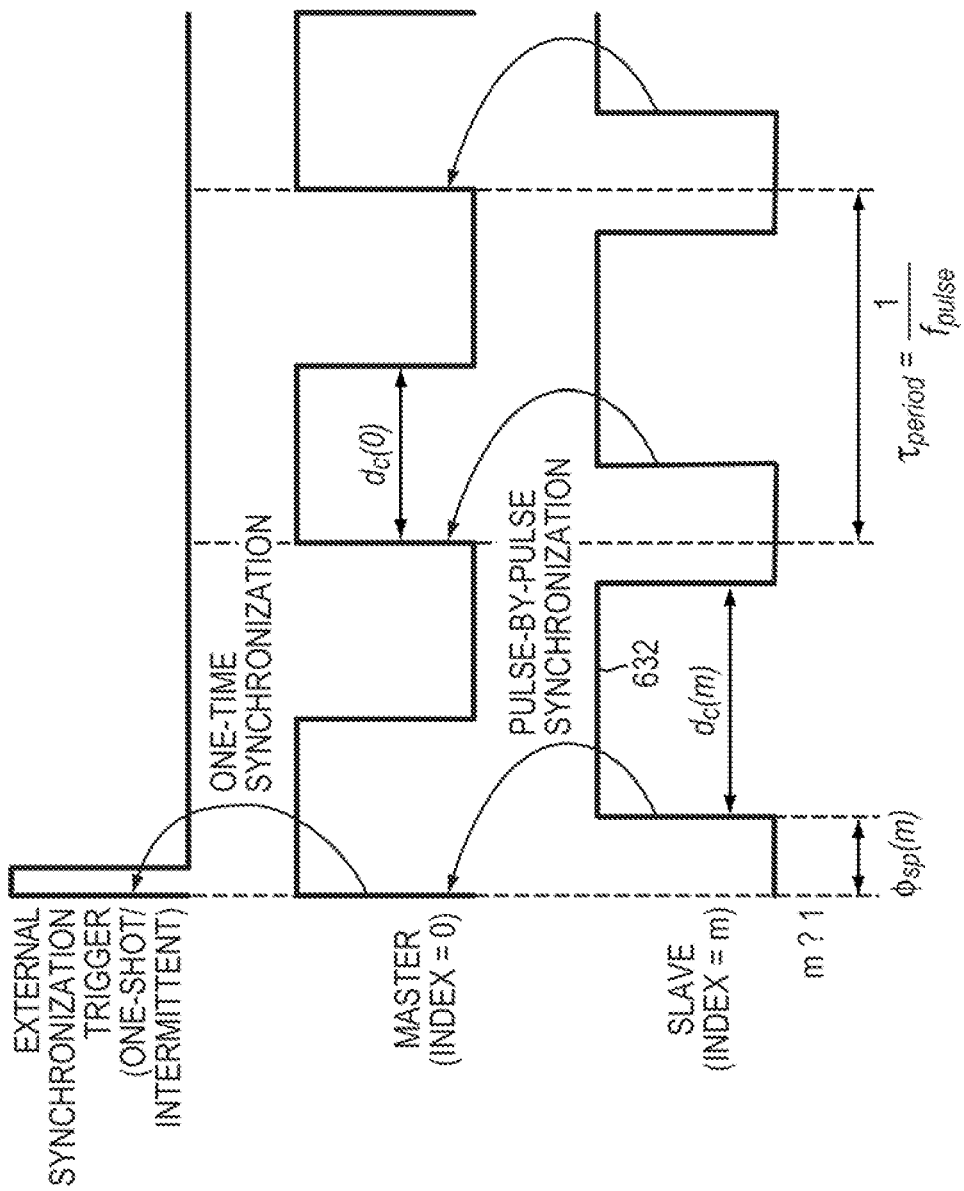

METHOD AND SYSTEM FOR CONTROLLING RADIO FREQUENCY POWER

CROSS REFERENCE TO RELATED APPLICATIONS

This application is a divisional of U.S. patent application Ser. No. 12/491,538, filed on Jun. 25, 2009, which is owned by the assignee of the instant application and the disclosure of which is incorporated herein by reference in its entirety.

TECHNICAL FIELD

This invention relates generally to control systems for plasma processing equipment. In particular, the invention relates to methods and systems for controlling radio frequency (RF) power delivery systems.

BACKGROUND

RF power delivery systems provide power to dynamic loads typically at frequencies between about 400 kHz and about 200 MHz. Frequencies used in scientific, industrial and medical applications are approximately 2 MHz, 13.56 MHz, and 27 MHz. Depending on the application, RF power is delivered in a pulse and/or a continuous-wave mode to a load. Controlling delivered RF power has become increasingly important in semiconductor manufacturing as the dimensions of semiconductor features have continued to decrease. The ability to more precisely control RF power parameters enables a semiconductor manufacturer to achieve smaller semiconductor features. This is particularly difficult, however, when the RF power is delivered to dynamic loads.

Various approaches exist for controlling pulsed RF power that is delivered to dynamic loads. One approach is to use a look-up table of known operating parameters to control the amplitude and shape of delivered RF power on a pulse-by-pulse basis. Another approach is to use optimal, constant parameter estimates around a nominal operating point. A third approach is to use high-bandwidth and/or high-speed components (e.g., a power-sensing circuit, a digital signal processor, and/or a pre-regulator) to regulate the amplitude and shape of delivered RF power on a pulse-by-pulse basis.

Problems exist, however, with each of these known approaches. In the first and second approaches, performance can degrade when processing conditions change and/or drift from the values in the look-up table or the nominal operating point. In the third approach, high-speed components add significant cost to control systems. Moreover, the control system is susceptible to performance degradation due to the electrical noise associated with high gain and high bandwidth systems.

Various approaches exist for switching an RF power delivery system from a pulsed mode to a continuous-wave mode. One known approach is to use an open-loop system, where the input voltage to an RF power amplifier is fixed and pulses are generated by switching the RF power amplifier on and off. However, open-loop systems lack the ability to modify the delivered power based on changes in operating conditions at the load. Further, open-loop systems are unable to compensate for the high number of plasma oscillations that occur when using low-frequency pulses for plasma processing applications. Another known approach to switching between pulsed and continuous-wave power is to temporarily stop processing between power-delivery modes. However, temporarily stopping processing results in irregular processing after system start-up. Moreover, temporarily stopping processing results in an unstable plasma because the power is not constant. Finally, temporarily stopping processing increases processing and cycle time.

SUMMARY

The invention generally features a system and method for controlling pulsed RF power provided to dynamic loads. One advantage is the invention allows for a closed-loop system to more precisely and accurately control pulsed RF power (e.g., high-frequency and/or low-frequency pulsed power) delivered to dynamic loads. Another advantage is the invention allows for pulse-by-pulse control of the delivered RF power. In low-frequency systems, the invention can allow for pulse-by-pulse control of the pulse shape (e.g., the "flatness" and/or the amplitude of the pulse). In some embodiments, pulse-by-pulse control is achieved using lower-cost components than those used in known systems and methods. For example, lower-bandwidth and/or lower-speed components can be used. Yet another advantage is the invention allows for pulse-by-pulse control of power delivered to a dynamic load without degradation in, for example, the precision of the power parameters when process conditions change and/or drift from the values in a look-up table or nominal operating point. Another advantage is the invention allows for repeatable, high-precision power control.

The invention, in one aspect, features a method for controlling pulsed power. The method includes measuring a first pulse of power from a power amplifier to obtain data. The method also includes generating a first signal to adjust a second pulse of delivered power, the first signal correlated to the data to minimize a power difference between a power set point and a substantially stable portion of the second pulse. The method also includes generating a second signal to adjust the second pulse of delivered power, the second signal correlated to the data to minimize an amplitude difference between a peak of the second pulse and the substantially stable portion of the second pulse.

In some embodiments, the method includes providing the second signal as an input to a voltage source, the voltage source providing a voltage to a voltage to power converter. In some embodiments, the method includes correlating the second signal to a time delay measured between the voltage source receiving a set point and the voltage to power converter outputting power. In some embodiments, the method includes comprising calculating a shape error between a peak of the first pulse and a substantially stable portion of the first pulse. In some embodiments, the method also includes correlating the second signal to the shape error.

In some embodiments, the method includes calculating a power offset between the power set point and a substantially stable portion of the first pulse. The method can include correlating the first signal to the power offset. In some embodiments, the method includes providing the first signal as an input to a voltage source, the voltage source providing a voltage to a voltage to power converter. The method can include correlating the first signal to a duty cycle input of the voltage source.

The invention, in another aspect, features a method of power delivery. The method includes delivering power from a power amplifier in a continuous-wave mode to a load. The method also includes generating a signal in a feedback loop to control the delivered power, the signal correlated to a power control algorithm. The method also includes adjusting a single variable in the control algorithm to transition the delivered power from the continuous-wave mode to a pulsed mode.

In some embodiments, the method includes activating a switch in the feedback loop based on an input corresponding to the single variable, the switch in electrical communication with a power amplifier. In some embodiments, the method includes filtering the data to provide a substantially stable power measurement. In some embodiments, the method includes providing the signal as an input to a voltage source, the voltage source providing a voltage to a voltage to power converter. The method can include correlating the signal to a duty cycle input of the voltage source.

In some embodiments, the method includes calculating a power offset between a power set point and the delivered power. In some embodiments, the method includes measuring the delivered power to obtain data. In some embodiments, the method includes generating a second signal to adjust a shape of delivered pulsed power, the second signal correlated to the data to minimize an amplitude difference between a peak of a pulse and a substantially stable portion of the pulse. In some embodiments, the method includes correlating the second signal to a time delay measured between a voltage source receiving a set point and a voltage to power converter outputting power. In some embodiments, the method includes correlating the signal to the data to minimize a power difference between a power set point and a substantially stable portion of a pulse.

The invention, in another aspect, features a method of power delivery. The method includes delivering power from a power amplifier in a continuous-wave mode to a load. The method also includes measuring power delivered to the load. The method also includes generating a signal indicative of the power delivered using a feedback loop to control the amplitude of the power delivered, the signal corresponding to a power control algorithm. The method also includes adjusting a single variable in the algorithm to deliver pulsed power to the load via the same feedback loop.

In some embodiments, the method includes activating a switch in the feedback loop based on an input correlated to the single variable, the switch in electrical communication with a power amplifier. In some embodiments, the method includes activating a switch in the feedback loop based on an input corresponding to the single variable, the switch in electrical communication with a power amplifier. In some embodiments, the method includes filtering the data to provide a substantially stable power measurement.

In some embodiments, the method includes providing the signal as an input to a voltage source, the voltage source providing a voltage to a voltage to power converter. In some embodiments, the method includes correlating the signal to a duty cycle input of the voltage source. In some embodiments, the method includes calculating a power offset between a power set point and the delivered power.

In some embodiments, the method includes measuring the delivered power to obtain data. The method can include generating a second signal to adjust a shape of delivered pulsed power, the second signal correlated to the data to minimize an amplitude difference between a peak of a pulse and a substantially stable portion of the pulse. The method can include correlating the second signal to a time delay measured between a voltage source receiving a set point and a voltage to power converter outputting power. In some embodiments, the method includes correlating the signal to the data to minimize a power difference between a power set point and a substantially stable portion of a pulse.

The invention, in another aspect, features a system for delivering pulsed or continuous-wave RF power to a load. The system includes a voltage to power converter coupled to an output of a voltage source, the voltage to power converter adapted to generate the pulsed RF power or the continuous-wave RF power. The system also includes a RF power amplifier coupled to an output of the voltage to power converter, the RF power amplifier adapted to deliver RF power to the load. The system also includes a pulse shape control loop coupled to an output of the RF power amplifier and a first input of the voltage source, the pulse shape control loop adapted to minimize an amplitude difference between a peak of the pulsed power and a substantially stable portion of the pulsed power, the pulse shape control loop adapted to operate when the pulsed RF power is in a first mode. The system also includes a power set point control loop coupled to the output of the RF power amplifier and a second input of the voltage source, the power set point control loop adapted to minimize a power difference between a RF power set point and the RF power delivered to the load.

In some embodiments, the power set point control loop is coupled to an output of the voltage source. In some embodiments, the power set point control loop includes a voltage offset circuit, the voltage offset circuit configured to measure a voltage offset between a voltage output from the voltage source and a voltage setpoint from the power set point control loop.

In some embodiments, the power set point control loop includes a switch in electrical communication with the output of the RF power amplifier. The switch can have a switching frequency correlated to a pulsing frequency of the pulsed RF power. In some embodiments, the system includes a matching network coupled to an output of the voltage to power converter and an input of the load. In some embodiments, the power set point control loop includes an output conditioning module coupled to the second input of the voltage source and the pulse set point control loop, the output conditioning module providing a duty cycle input to the voltage source. The voltage source can be a buck regulator. In some embodiments, the power set point control loop includes a digital-to-analog converter.

The invention, in another aspect, features a system for delivering pulsed or continuous-wave RF power to a load. The system includes a voltage to power converter coupled to an output of a voltage source, the voltage to power converter adapted to produce the pulsed RF power or the continuous-wave RF power. The system also includes a RF power amplifier coupled to an output of the voltage to power converter, the RF power amplifier adapted to deliver RF power to the load. The system also includes a first control circuit coupled to an output of the RF power amplifier and a current set point output. The system also includes a second control circuit coupled to an input of the voltage source and an output of the voltage source, the second control circuit in electrical communication with the current set point output. The first and second control circuits, in combination, are adapted to minimize a power difference between a RF power set point and the RF power delivered to the load.

In some embodiments, the system includes a third control circuit coupled to the output of the voltage source and a voltage set point output of the second control circuit. In some embodiments, the system includes the first control circuit includes a switch in electrical communication with the output of the RF power amplifier. In some embodiments, the system includes at least one filter in electrical communication with the switch and the output of the RF power amplifier. In some embodiments, the at least one filter is adapted to provide a substantially stable power measurement.

In some embodiments, the system includes at least one feed-forward input coupled to the second control circuit. The at least one feed-forward input can include a voltage set point input. The at least one feed-forward input can include a current set point input. In some embodiments, the second circuit includes a conditioning module, the conditioning module providing a duty cycle input to the voltage source. In some embodiments, the system includes a pulse shape control loop coupled to an output of the RF power amplifier and a second input of the voltage source, the pulse shape control loop adapted to minimize an amplitude difference between a peak of the pulsed power and a substantially stable portion of the pulsed power, the pulse shape control loop adapted to operate when the pulsed RF power is in a first mode.

The invention, in another aspect, features a method of synchronizing power delivery systems. The method includes generating a master pulsed power from a master power delivery system. The method also includes generating a synchronizing pulse signal, the synchronizing pulse signal having a first frequency correlated to a pulse frequency of the master pulsed power. The method also includes generating a slave pulsed power from a slave power delivery system. The method also includes synchronizing the slave pulsed power with the synchronizing pulse signal.

In some embodiments, the synchronizing step includes calculating a second frequency of the slave pulsed power based on the first frequency of the synchronizing pulse signal. In some embodiments, the calculating step includes measuring a time period between a falling edge and a rising edge of the synchronization signal.

In some embodiments, the method includes calculating the second frequency of the slave pulsed power based on a falling edge of the synchronizing pulse signal. In some embodiments, the method includes calculating the second frequency of the slave pulsed power based on a rising edge of the synchronizing pulse signal. In some embodiments, the method includes delaying a phase of the slave pulsed power relative to the master pulsed power.

In some embodiments, the method includes receiving the synchronizing pulse signal from the master power delivery system. In some embodiments, the method includes receiving the synchronizing pulse signal from an external signal generator.

The invention, in another aspect, features a system for synchronizing power delivery systems. The system includes a master power delivery system adapted to generate a master pulsed power. The system also includes an external signal generator in electrical communication with the master power delivery system. The system also includes a slave power delivery system in electrical communication with the external signal generator, wherein the slave power delivery system generates a slave pulsed power having a frequency correlated to a synchronization signal generated by the external signal generator.

BRIEF DESCRIPTION OF THE DRAWINGS

The foregoing and other objects, feature and advantages of the invention, as well as the invention itself, will be more fully understood from the following illustrative description, when read together with the accompanying drawings which are not necessarily to scale.

FIG. 6C is a graphical representation of synchronization of the slave RF power delivery system of FIG. 6A to the master RF power delivery system of FIG. 6A, according to another illustrative embodiment of the invention.

DETAILED DESCRIPTION

Figure 1:
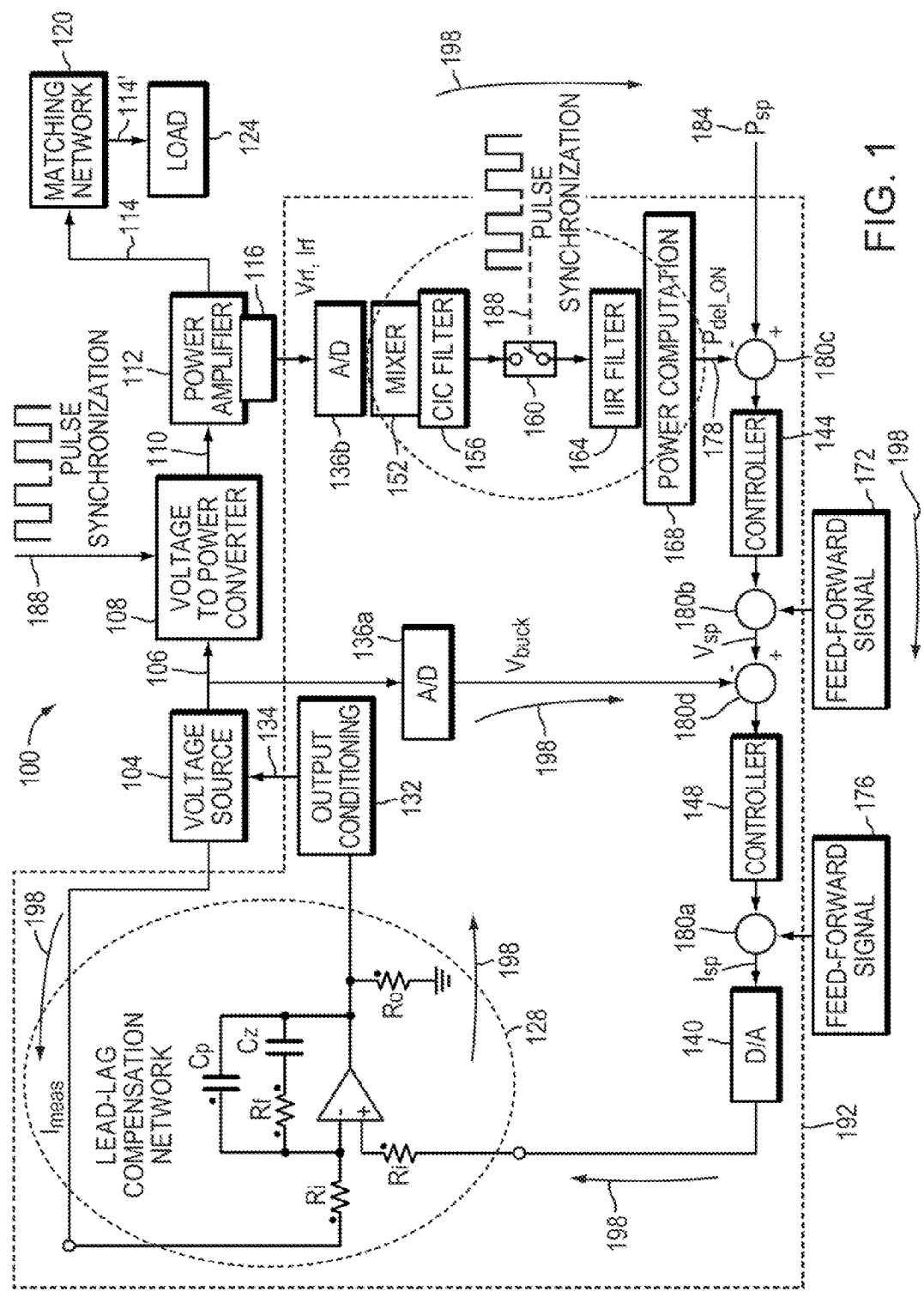
FIG. 1 is a schematic illustration of an RF power delivery system, according to an illustrative embodiment of the invention.

FIG. 1 is a schematic illustration of an RF power delivery system 100, according to an illustrative embodiment of the invention. The system 100 includes a voltage source 104 electrically coupled to a voltage to power converter 108. The voltage source 104 provides a DC voltage signal 106 to the voltage to power converter 108. In some embodiments, the voltage source 104 is a buck regulator. A buck regulator receives an unregulated input voltage and produces a lower, regulated output voltage.

The voltage to power converter 108 creates a DC power signal 110 (e.g., a pulsed signal or a continuous wave signal) based on the DC voltage signal 106 from the voltage source 104. The voltage to power converter 108 outputs a pulsed or continuous wave signal based on properties of a synchronization signal 188 provided to the voltage to power converter 108. If the synchronization signal 188 is a pulse signal (as shown), the DC power signal 110 output by the voltage to power converter 108 is pulses of DC power having the same frequency and period as the pulses of the synchronization signal 188. If, however, the synchronization signal 188 is a continuous-wave signal (not shown), the DC power signal 110 output by the voltage to power converter 108 is a continuous-wave DC power signal.

The voltage to power converter 108 is electrically coupled to a power amplifier 112 (e.g., an RF power amplifier). The voltage to power converter 108 provides the DC power signal 110 to the power amplifier 112. The power amplifier 112 outputs an RF power signal 114 based on the DC power signal 110 received from the voltage to power converter 108. The power amplifier 112 can output the RF power signal with the same properties (e.g., pulses or continuous wave) as the properties of the DC power signal or with different properties. In some embodiments, the power amplifier 112 outputs an RF power signal 114 with properties that are selected by an operator (or specified by a process controller) that is desired for load 124.

The operating radio frequency of the power amplifier 112 can be manually (open-loop) or automatically (closed-loop) tuned to a specific frequency. In either case, an operator provides a minimum and maximum allowable frequency limits (e.g., ±5% of center frequency 13.56 MHz) to the control system 192 or power amplifier 112. In some embodiments, the minimum and maximum frequency limits are based on the characteristics of the load to, for example, maximize power transfer from the power amplifier 112 to the load 124. In another embodiment, when operating the system in a pulsed operating mode, the operator specifies the pulsing frequency and duty cycle to the control system 192. The desired values for the pulsing frequency and duty cycle also are based on the characteristics of the load. In some embodiments, the power amplifier 112 outputs an RF power signal 114 at frequencies between about 400 kHz and about 200 MHz. Typical RF Frequencies used in scientific, industrial and medical applications are approximately 2 MHz, 13.56 MHz, and 27 MHz.

The RF power amplifier signal 114 output by the power amplifier 112 can be transitioned from a continuous-wave mode to a pulsed mode by transitioning the synchronization signal 188 from a continuous-wave signal to a pulsed signal. By transitioning from, for example, a continuous-wave signal to a pulsed signal by adjusting a single variable (i.e., synchronization signal 188) in the power control algorithm (EQN. 5, described below), the power control algorithm transitions the delivered power from the continuous-wave mode to the pulsed mode. Likewise, the RF power signal 114 output by the power amplifier 112 can be transitioned from a pulsed mode to a continuous-wave mode by transitioning the synchronization signal 188 from a pulsed mode (shown) to a continuous-wave signal.

The power amplifier 112 outputs the RF power signal 114 to an optional matching network 120. In one embodiment, a power amplifier is used that has the following nominal operating levels: 300 volt (RMS); 12 amps (RMS) and 3.5 kW. The matching network 120 is used in some embodiments of the invention to match the impedance between the power amplifier 112 and the load 124. It is desirable to match the impedance between the power amplifier 112 and the load 124 to minimize the RF power that would otherwise be reflected back into the power amplifier from the load 124. The matching network 120 outputs a modified RF power signal 114' in response to the RF power signal received from the power amplifier 112. In some embodiments, an estimate (or measured value) of the power dissipated in the matching network 120 is used to calibrate the system and modify the output of the power amplifier 112 to insure that the load 124 receives the desired power.

The modified RF power signal 114' is provided to the load 124 (e.g., a plasma processing chamber used to process semiconductor wafers). In some embodiments, properties (e.g., impedance) of the load 124 vary during operation. Properties of the load 124 may vary based on changes in, for example, process conditions in a plasma chamber (e.g., gas flow rate, gas composition, and chamber pressure) and properties associated with the RF power delivered to the load (e.g., peak RF power, RF pulse frequency, RF pulse width/duty cycle).

The RF power delivery system 100 also includes a control system 192. The power amplifier 112 is in electrical communication with the components of the control system 192. The control system 192 provides a feedback loop 198 used to control operation of the various components (e.g., voltage source 104, voltage to power converter 108 and power amplifier 112) of the RF power delivery system. The control system 192 includes an analog compensation network 128 electrically coupled to the voltage source 104 and an output conditioning module 132. The output conditioning module 132 provides a control signal 134 (e.g., a pulse width modulated control signal or duty cycle input) to the voltage source 104 that controls the output of the voltage source 104.

The control system 192 also includes a first analog-to-digital (A/D) converter 136a. The A/D converter 136a is electrically coupled to the output of the voltage source 104. The control system 192 also includes a second analog-to-digital (A/D) converter 136b. The A/D converter 136b is electrically coupled to the output of a probe 116. The probe 116 is electrically coupled to the power amplifier 112 to measure properties (e.g., data for the RF power signal) of the RF power signal 114 output by the power amplifier 112. In this embodiment, the probe 116 outputs the voltage signal ($V_{rf}$) and current signal ($I_{rf}$), which are measures of the RF power signal 114. $V_{rf}$ and $I_{rf}$ have the following form:

$$V_{rf} = V_R + jV_I \qquad \text{EQN. 1}$$

$$I_{rf} = I_R + jI_I \qquad \text{EQN. 2}$$

where $V_R$ is the real component of the $V_{rf}$ signal, $V_I$ is the imaginary component of the $V_{rf}$ signal, $I_R$ is the real component of the $I_{rf}$ signal, $I_I$ is the imaginary component of the $I_{rf}$ signal.

In one embodiment, the voltage signal ($V_{rf}$) and the current signal ($I_{rf}$) output by the probe 116 are both sinusoidal signals when the RF power signal 114 is a sinusoidal signal. Exemplary probes 116 for use in different embodiments of the invention are the Model VI-Probe-4100 and VI-Probe-350 (MKS Instruments, Inc., Andover, Mass.).

The A/D converter 136b samples the two signals ($V_{rf}$ and $I_{rf}$) and outputs digital signals [digital voltage signal ($V_{rf\text{-}dig}$) and digital current signal ($I_{rf\text{-}dig}$)].

The digital voltage signal ($V_{rf\text{-}dig}$) and digital current signal ($I_{rf\text{-}dig}$) are provided to a digital signal processing module 196 to produce a digital signal ($P_{del\_ON}$) that is the output power of the power amplifier 112. The processing module 196 includes a digital mixer 152, a CIC filter module 156, a switch 160, an IIR filter module 164 and a power computation module 168. The digital mixer 152 converts a time varying signal into the real and imaginary components of the signal at a specified frequency. The decomposition achieved by multiplying the measured signal with a reference cosine and a reference negative sine wave of the fundamental frequency produces DC components and a double frequency sine wave. The DC component obtained by multiplying the cosine represents the real component and the DC component obtained by multiplying the negative sine wave represents the imaginary component. The double frequency components are filtered out by the CIC filter.

The output of the A/D converter 136b ($V_{rf\text{-}dig}$ and $I_{rf\text{-}dig}$) is provided to the mixer 152. The mixer 152 performs mathematical calculations with the digital voltage signal ($V_{rf\text{-}dig}$) and digital current signal ($I_{rf\text{-}dig}$) to produce the real and imaginary portions of the digital voltage signal ($V_{rf\text{-}dig}$) and digital current signal ($I_{rf\text{-}dig}$) of the form:

$$V_{rf-dig} = (V_{R-dig} + 2*\omega) + j(V_{I-dig} + 2*\omega) \qquad \text{EQN. 3}$$

$$I_{rf-dig} = (I_{R-dig} + 2*\omega) + j(I_{I-dig} + 2*\omega) \qquad \text{EQN. 4}$$

where $V_{R\text{-}dig}$ is the real component of the digital version of $V_{rf}$, $V_{I\text{-}dig}$ is the imaginary component of the digital version of $V_{rf}$, $I_{R\text{-}dig}$ is the real component of the digital version of $I_{rf}$, and $I_{I\text{-}dig}$ is the imaginary component of the digital version of $I_{rf}$, and where each component of the digital signals has a component equal to 2*ω, where ω is the sampling frequency of the A/D converter. These signals are then provided to the CIC filter module 156 to remove the 2*ω component of the signals.

In one embodiment, the CIC filter module 156 is a low pass filter. In one embodiment, the cutoff frequency of the low pass filter is approximately 25 kHz. The CIC filter module 156 filters, for example, signal frequencies associated with the processing requirements of the system (e.g., typical frequencies used on scientific, industrial and medical applications of approximately 2 MHz, 13.56 MHz and 27 MHz).

The output of the CIC filter module 156 is provided to the switch 160. The switch 160 is driven between open and closed positions by the synchronization signal 188. The switch 160 is closed when the pulse magnitude is 1 and the switch is closed when the pulse magnitude is 0. The output of the switch 160 is provided to the IIR filter module 164.

When the switch 160 is in the closed position, the current value of the DC signal is provided to the IIR filter module 164. When the switch 160 is in the open position, the previous value of the DC signal is provided to the IIR filter module 164. The IIR filter module 164 is typically a low pass filter used to smooth the signals that are provided to the power computation module 168. The IIR filter module 164 typically smoothes noise/high frequency components that would otherwise be present due to the switch 160 being cycled between open and closed positions. The CIC filter module 156 and IIR filter module 164 filter the signals in the digital signal processing module 196 of the feedback loop 198 to provide a stable (the term which includes substantially stable) power measurement (digital signal 178). The output of the IIR filter module 164 is provided to the power computation module 168. The power computation module 168 calculates the power based on the following power control algorithm:

$$P_{del\_ON} = V_{R\text{-}dig}I_{R\text{-}dig} + V_{I\text{-}dig}I_{I\text{-}dig} \qquad \text{EQN. 5}$$

The power computation module 168 outputs the digital signal 178 ($P_{del\_ON}$). The signal 178 is the delivered power (power delivered to the load 124). An operator or processor (not shown) provides a power setpoint signal 184 ($P_{sp}$) to the RF power delivery system 100 which is the RF power signal desired to be provided to the load 124. In some embodiments, a mathematical model of the desired operation of the system is implemented on the processor to produce the power setpoint signal 184. A summation module 180c calculates a power offset, the difference between the power setpoint signal 184 and the output of the power computation module 168 (error e), based on the following:

$$e = P_{sp} - P_{del\_ON} \qquad \text{EQN. 6}$$

If the difference between the power setpoint signal 184 and the output of the power computation module 168 is zero, the power amplifier 112 is providing the desired RF power signal to the load 124. If the difference is not zero, the system works to reduce the difference (error e).

The RF power delivery system 100 includes a first controller module 144 that receives the output of the summation module 180c (i.e., the difference between the power setpoint signal 184 and the output 170 of the power computation module 168). The controller module 144 attempts to reduce the error between a measured process variable (i.e., output of power computation module 168) and a desired setpoint (i.e., power setpoint 184) by calculating and then outputting a corrective action that can adjust the process accordingly.

In one embodiment, the controller module 144 is a proportional-integral-derivative (PID) controller module. The proportional value determines the reaction of the controller 144 to the current error, the integral value determines the reaction of the controller 144 based on the sum of recent errors, and the derivative value determines the reaction of the controller 144 based on the rate at which the error has been changing. The weighted sum of these three actions is used to adjust the process via a control element based on the following:

$$V_{control} = k_p e + k_i \int e\, d\tau + k_d \frac{de}{dt} \qquad \text{EQN. 7}$$

where $k_p$ is the value of the scalar constant for the proportional component of the PID control algorithm, $k_i$ is the value of the scalar constant for the integral component of the PID control algorithm, $k_d$ is the value of the scalar constant for the derivative component of the PID control algorithm, and e is the error calculated in EQN. 6.

In this embodiment of the invention, the controller 144 outputs a signal that is ultimately provided to the output conditioning module 132. The output conditioning module 132 controls operation of the voltage source 104 which in turn ultimately controls the power output by the power amplifier 112. By tuning three constants in the PID controller algorithm, the controller can provide control action designed for specific process requirements. The response of the controller can be described in terms of the responsiveness of the controller to an error, the degree to which the controller overshoots the setpoint and the degree of system oscillation. Alternative controller types (e.g., state-space controllers, adaptive controllers, fuzzy-logic controller) can be used in alternative embodiments of the invention.

The output ($V_{control}$) of the controller 144 is combined (e.g., summed) with a first feed-forward signal 172 with summing module 180b to produce a voltage setpoint signal ($V_{sp}$). The first feed-forward signal 172 is typically generated using a mathematical model of the desired operation of the system 100. In some embodiments, the first feed-forward signal 172 varies as a function of time (t). In some embodiments, the first feed-forward signal 172 is generated by an operator. A feed-forward signal is typically used to ensure faster convergence to a given setpoint based on system information and parameters. In addition, a nonlinear feed-forward signal may be used in conjunction with a linear feedback function (e.g., PID control) to achieve fast control in a nonlinear system.

A summation module 180d calculates the difference between the voltage setpoint signal ($V_{sp}$) and the output of an A/D converter 136a. A/D converter 136a samples the output of the voltage source 104 and produces a digital version of the voltage source's 104 output ($V_{buck}$). Summation module 180d calculates the difference (error $e_v$) between the voltage setpoint signal ($V_{sp}$) and $V_{buck}$ based on the following:

$$e_v = V_{sp} - V_{buck} \qquad \text{EQN. 8}$$

If the difference between the voltage setpoint signal ($V_{sp}$) and $V_{buck}$ is zero, the power amplifier 112 is providing the desired RF power signal to the load 124. If the difference is not zero, the system works to reduce the difference (error $e_v$).

The RF power delivery system 100 also includes a second controller module 148 that receives the output of the summation module 180d (i.e., the difference between the voltage setpoint signal ($V_{sp}$) and $V_{buck}$). The controller module 148 attempts to correct the error between a measured process variable (i.e., output of voltage source 104) and a desired setpoint (i.e., voltage setpoint $V_{sp}$) by calculating and then outputting a corrective action that can adjust the process accordingly.

In one embodiment, the controller module 148 is a proportional-integral-derivative (PID) controller module. The proportional value determines the reaction of the controller 148 to the current error, the intergal value determines the reaction of the controller 148 based on the sum of recent errors, and the derivative value determines the reaction of the controller 148 based on the rate at which the error has been changing. The weighted sum of these three actions is used to adjust the process via a control element based on the following $$I_{control} = k_{pv}e_v + k_{vi}\int e_v d\tau + k_{dv}\frac{de_v}{dt} \qquad \text{EQN. 9}$$

where $k_{pv}$ is the value of the constant for the proportional component of the PID control algorithm, $k_{iv}$ is the value of the constant for the integral component of the PID control algorithm, $k_{dv}$ is the value of the constant for the derivative component of the PID control algorithm, and $e_v$ is the error calculated in EQN. 8.

In this embodiment of the invention, the controller 148 outputs a signal that is ultimately provided to the output conditioning module 132. The output conditioning module 132 controls operation of the voltage source 104 which in turn ultimately controls the power output by the power amplifier 112. By tuning three constants in the PID controller algorithm, the controller can provide control action designed for specific process requirements. The response of the controller can be described in terms of the responsiveness of the controller to an error, the degree to which the controller overshoots the setpoint and the degree of system oscillation. Alternative controller types (e.g., state-space controllers, adaptive controllers, fuzzy-logic controller) can be used in alternative embodiments of the invention.

The output of the controller 148 is combined (e.g., summed) with a second feed-forward signal 176 with summing module 180a to produce a current setpoint signal ($I_{sp}$). The second feed-forward signal 176 is typically generated using a mathematical model of the desired operation of the system 100. In some embodiments, the second feed-forward signal 176 varies as a function of time (t). In some embodiments, the second feed-forward signal 176 is generated by an operator.

The current setpoint signal ($I_{sp}$) is provided to a digital to analog converter 140 which produces an analog signal version of the current setpoint signal ($I_{sp}$). The analog signal version of the of the current setpoint signal ($I_{sp}$) is provided to an analog circuit compensation network 128. The analog circuit compensation network 128 also receives a signal ($I_{meas}$) that is the measured current from the voltage source 104. In this embodiment, the analog circuit compensation network 128 is a lead-lag compensation network that increases the phase margin in the system and provides a signal to the output conditioning module 132. As discussed previously herein, the output conditioning module 132 provides a control signal (e.g., a pulse width modulated control signal) to the voltage source 104 that controls the output of the voltage source 104.

Figure 2:
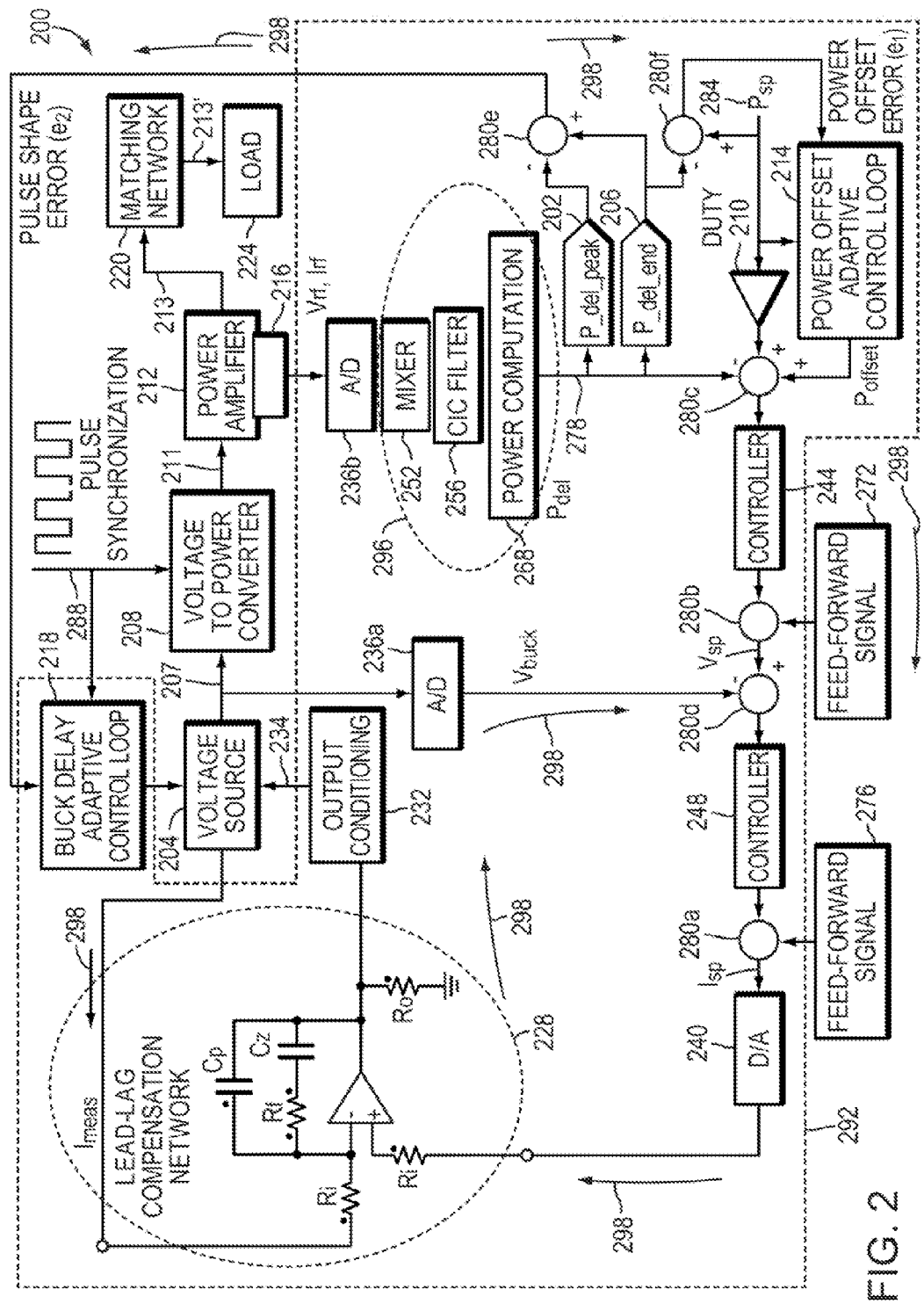
FIG. 2 is a schematic illustration of an RF power delivery system, according to an illustrative embodiment of the invention.

FIG. 2 is a schematic illustration of an RF power delivery system 200, according to an illustrative embodiment of the invention. The system 200 includes a voltage source 204 electrically coupled to a voltage to power converter 208. The voltage source 204 provides a DC voltage signal 207 to the voltage to power converter 208. In some embodiments, the voltage source 204 is a buck regulator. A buck regulator receives an unregulated input voltage and produces a lower regulated output voltage. The voltage to power converter 208 creates a DC power signal 211 (e.g., a pulsed signal or a continuous wave signal) based on the DC voltage signal 207 from the voltage source 204. The voltage to power converter 208 outputs a pulsed or continuous wave signal based on properties of a synchronization signal 288 provided to the voltage to power converter 208. If the synchronization signal 288 is a pulse signal (as shown), the DC power signal 211 output by the voltage to power converter 208 is pulses of DC power having the same frequency and period as the pulses of the synchronization signal 288. If, however, the synchronization signal 288 is a continuous wave signal (not shown), the DC power signal 211 output by the voltage to power converter 208 is a continuous wave DC power signal.

The voltage to power converter 208 is electrically coupled to a power amplifier 212 (e.g., an RF power amplifier). The voltage to power converter 208 provides the DC power signal 211 to the power amplifier 212. The power amplifier 212 outputs an RF power signal 213 based on the DC power signal 211 received from the voltage to power converter 208. The power amplifier 212 can output the RF power signal 213 with the same properties (e.g., pulses or continuous wave) as the properties of the DC power signal or with different properties. In some embodiments, the power amplifier 212 outputs an RF power signal 213 that is selected by an operator (or specified by a process controller) that is desired for load 224. In some embodiments, the power amplifier 212 outputs an RF power signal at frequencies between about 400 kHz and about 200 MHz. Typical RF Frequencies used in scientific, industrial and medical applications are approximately 2 MHz, 13.56 MHz, and 27 MHz.

The RF power amplifier signal 213 output by the power amplifier 212 can be transitioned from a continuous-wave mode to a pulsed mode by transitioning the synchronization signal 288 from a continuous-wave signal to a pulsed signal. By transitioning from, for example, a continuous-wave signal to a pulsed signal, by adjusting a single variable (i.e., synchronization signal 288) in the power control algorithm (EQN. 13, described below), the power control algorithm transitions the delivered power from the continuous-wave mode to the pulsed mode. Likewise, the RF power signal 213 output by the power amplifier 212 can be transitioned from a pulsed mode to a continuous-wave mode by transitioning the synchronization signal 288 from a pulsed mode (shown) to a continuous-wave signal.

The power amplifier 212 outputs the RF power signal 213 to an optional matching network 220. The matching network 220 is used in some embodiments of the invention to match the impedance between the power amplifier 212 and the load 224. It is desirable to match the impedance between the power amplifier 212 and the load 224 to minimize the RF power that would otherwise be reflected back into the power amplifier from the load 224. The matching network 220 outputs a modified RF power signal 213' in response to the RF power signal 213 received from the power amplifier 212.

The modified RF power signal 113' is provided to the load 224 (e.g., a plasma processing chamber used to process semiconductor wafers). In some embodiments, properties (e.g., impedance) of the load 224 vary during operation. Properties of the load 224 may vary based on changes in, for example, process conditions in a plasma chamber (e.g., gas flow rate, gas composition, and chamber pressure) and properties associated with the RF power delivered to the load (e.g., peak RF power, RF pulse frequency, RF pulse width/duty cycle).

The RF power delivery system 200 also includes a control system 292. The power amplifier 212 is in electrical communication with the control system 292. The control system 292 provides a feedback loop 298 used to control operation of various components (e.g., voltage source 204, voltage to power converter 208 and power amplifier 212) of the RF power delivery system 200. The control system 292 includes an analog compensation network 228 electrically coupled to the voltage source 204 and an output conditioning module 232. The output conditioning module 232 provides a control signal (e.g., a pulse width modulated control signal or duty cycle input) to the voltage source 204 that controls the output of the voltage source 204.

The control system 292 also includes a first analog to digital (A/D) converter 236a. The A/D converter 236a is electrically coupled to the output of the voltage source 204. The control system 292 also includes a second analog to digital (A/D) converter 236b. The A/D converter 236b is electrically coupled to the output of a probe 216. The probe 216 is electrically coupled to the power amplifier 212 to measure properties (e.g., data for the RF power signal) of the RF power signal output by the power amplifier 212. In this embodiment, the probe 216 outputs the voltage signal ($V_{rf}$) and current signal ($I_{rf}$) of the RF power signal, which are measures of the RF power signal 213. $V_{rf}$ and $I_{rf}$ have the following form:

$$V_{rf} = V_R + jV_I \qquad \text{EQN. 9}$$

$$I_{rf} = I_R + jI_I \qquad \text{EQN. 10}$$

where $V_R$ is the real component of the $V_{rf}$ signal, $V_I$ is the imaginary component of the $V_{rf}$ signal, $I_R$ is the real component of the $I_{rf}$ signal, $I_I$ is the imaginary component of the $I_{rf}$ signal.

In one embodiment, the voltage signal ($V_{rf}$) and the current signal ($I_{rf}$) output by the probe 216 are both sinusoidal signals. Exemplary probes 216 for use in different embodiments of the invention are the Model VI-Probe-4100 and VI-Probe-350 (MKS Instruments, Inc., Andover, Mass.). The A/D converter 236b samples the two signals ($V_{rf}$ and $I_{rf}$) and outputs digital signals [digital voltage signal ($V_{rf\text{-}dig}$) and digital current signal ($I_{rf\text{-}dig}$)].

The digital voltage signal ($V_{rf\text{-}dig}$) and digital current signal ($I_{rf\text{-}dig}$) are provided to a digital signal processing module 296 to produce a digital signal $P_{del}$) that is the output power of the power amplifier 212. The processing module 296 includes a digital mixer 252, a CIC filter module 256, and a power computation module 268. The output of the A/D converter 236b ($V_{rf\text{-}dig}$ and $I_{rf\text{-}dig}$) is provided to the mixer 252. The mixer 252 performs mathematical calculations with the digital voltage signal ($V_{rf\text{-}dig}$) and digital current signal ($I_{rf\text{-}dig}$) to produce the real and imaginary portions of the digital voltage signal ($V_{rf\text{-}dig}$) and digital current signal ($I_{rf\text{-}dig}$) of the form:

$$V_{rf-dig} = (V_{R-dig} + 2*\omega) + j(V_{I-dig} + 2*\omega) \qquad \text{EQN. 11}$$

$$I_{rf-dig} = (I_{R-dig} + 2*\omega) + j(I_{I-dig} + 2*\omega) \qquad \text{EQN. 12}$$

where $V_{R\text{-}dig}$ is the real component of the digital version of $V_{rf}$, $V_{I\text{-}dig}$ is the imaginary component of the digital version of $V_{rf}$, $I_{R\text{-}dig}$ is the real component of the digital version of $I_{rf}$, and $I_{I\text{-}dig}$ is the imaginary component of the digital version of $I_{rf}$, and where each component of the digital signals has a component equal to $2*\omega$, where $\omega$ is the sampling frequency of the A/D converter. These signals are then provided to the CIC filter module 256 to remove the $2*\omega$ component of the signals. The DC signal output by the CIC filter module 256 is provided to the power computation module 268. The power computation module calculates the power based on the following power control algorithm:

$$P_{del} = V_{R-dig}I_{R-dig} + V_{I-dig}+I_{I-dig} \qquad \text{EQN. 13}$$

The power computation module 268 outputs the digital signal 278 ($P_{del}$). The signal 278 is the delivered power (i.e., power delivered to the load 224). An operator or processor (not shown) provides a power setpoint signal 284 ($P_{sp}$) to the RF power delivery system 200 which is the RF power signal desired to be provided to the load 224. In some embodiments, a mathematical model of the desired operation of the system is implemented on the processor to produce the power setpoint signal 284.

Figure 3:
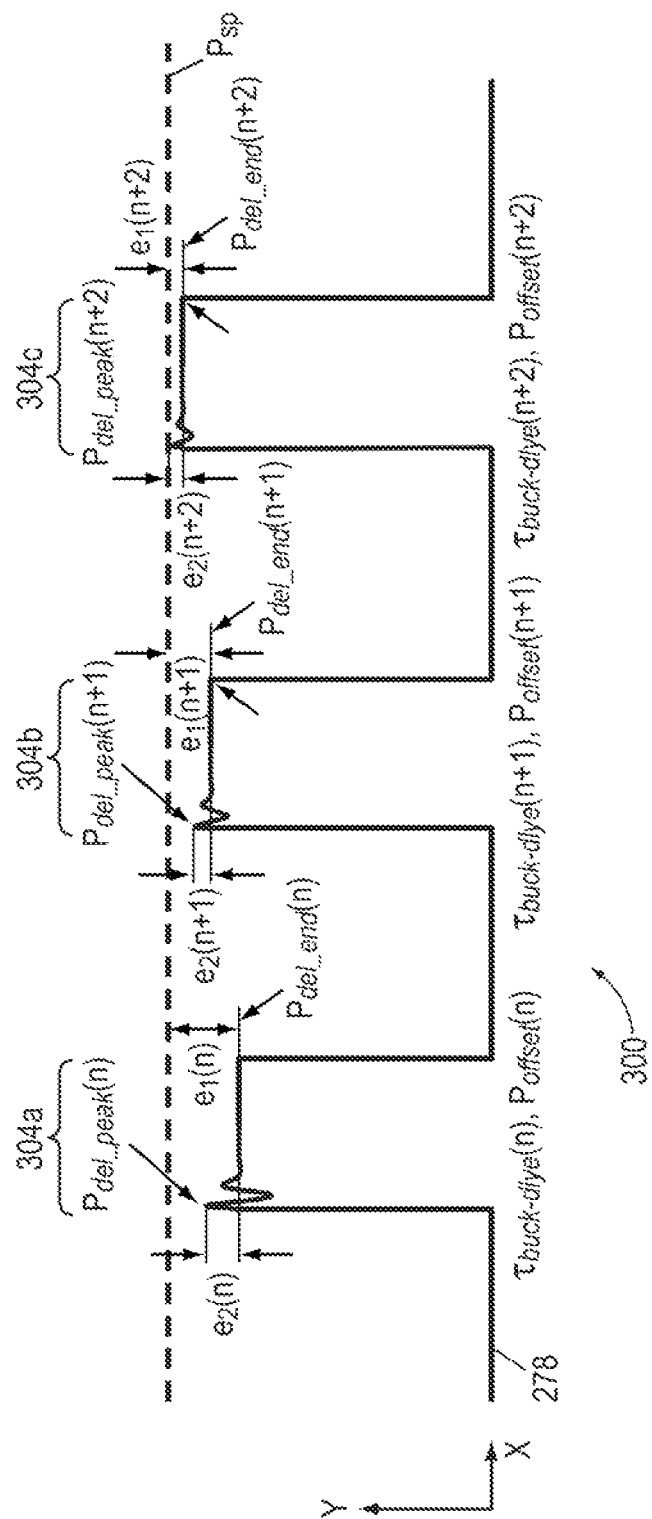
FIG. 3 is a graphical representation of an RF power signal varying from pulse to pulse, according to an illustrative embodiment of the invention.

FIG. 3 is a graphical representation of a plot 300 of the digital signal 302 which is the digital signal 278 ($P_{del}$) of FIG. 2. Referring to FIG. 3, the digital signal 278 varies from pulse to pulse as a result of applying a method for controlling the delivery of power, according to an illustrative embodiment of the invention described in FIG. 2. The Y-Axis of the plot 300 is the digital representation of the RF power signal 213 output by the power amplifier 212. The X-Axis of the plot is time. In this embodiment, the plot 300 illustrates three pulses of power [304a, 304b and 304c (generally, 304)] output by the power amplifier 212. It is desirable for each pulse 304 to have a constant value $P_{sp}$ (power setpoint). However, in practice, the pulses 304 are not ideal pulses and therefore there is an error between the desired pulse and the actual pulses of power output by the power amplifier 212.

The system 200 corrects for the error between the desired pulse and the actual pulses of power output by the power amplifier 212. The error for each pulse 304 is characterized by a first error component $e_1$ and a second error component $e_2$. Error component $e_1$ is the error between the power setpoint ($P_{sp}$) and the substantially stable (steady state) portion of the delivered power $P_{del}$. The value for $P_{del}$ used in calculating error component $e_1$ is the power at the end of the pulse. Error $e_1(n)$ is the first error component for the $n^{th}$ pulse and is referred to as power offset error ($e_1$) in FIG. 2. Error component $e_2$ is the error between the peak power delivered for a pulse ($P_{del\_peak}$) and the substantially stable (steady state) portion of the delivered power $P_{del}$. Error $e_2(n)$ is the second error component for the $n^{th}$ pulse and is referred to as pulse shape error ($e_2$) in FIG. 2. In operation, the power delivery system 200 reduces the errors $e_1$ and $e_2$ from a first pulse (e.g., pulse 304a) to a subsequent, second pulse (e.g., pulse 304b). Similarly, the power delivery system 200 reduces the errors $e_1$ and $e_2$ between each successive set of pulses (e.g., a first pulse 304b to the subsequent second pulse 304c).

A first pulse of the synchronization signal 288 is provided to the voltage to power converter 208. The voltage to power converter 208 provides a DC power pulse (DC power signal 211) to the power amplifier 212. The power amplifier 212 outputs a first pulse of power (RF power signal 213) to the matching network 220. The probe 216 measures the pulse of power (RF power signal 213) and outputs the voltage signal ($V_{rf}$) and current signal ($I_{rf}$) of the RF power signal to the A/D converter 236b, as described previously herein. The power computation module 268 receives the output of the A/D converter 236b and outputs the digital signal ($P_{del}$), as described previously herein.

The power offset error ($e_1$) is provided to a power offset adaptive control loop module 214. The power setpoint $P_{sp}$ also is provided to the module 214. The module 214 calculates a power offset signal ($P_{offset}$) based on the following adaptive algorithm:

$$\frac{d(P_{offset})}{dt} = k_{offset}(P_{sp} - P_{del\_end})$$ EQN. 14 where $k_{offset}$ is a scalar constant chosen by an operator to achieve the desired pulse power. Summation module 280c sums $P_{offset}$ with an output of the duty cycle module 210, and subtracts $P_{del}$ from this sum. The output (error e) of the summation module 280c is determined based on the following:

$$e = P_{sp} \cdot D - P_{del}$$ EQN. 15 where D is the duty cycle set by the duty cycle module 210. The output of the summation module 280c is provided to the controller 244.

Controller 244 attempts to reduce the error between a measured process variable (i.e., output $P_{del}$ of the power computation module 268) and the sum of the power setpoint ($P_{sp}$) and output of the power offset adaptive control module 214.

In one embodiment, the controller module 244 is a proportional-integral-derivative (PID) controller module. The proportional value determines the reaction of the controller 244 to the current error, the intergal value determines the reaction of the controller 244 based on the sum of recent errors, and the derivative value determines the reaction of the controller 244 based on the rate at which the error has been changing. The weighted sum of these three actions is used to adjust the process via a control element based on the following:

$$V_{control} = k_p e + k_i \int e d\tau + k_d \frac{de}{dt}$$ EQN. 16 where $k_p$ is the value of the scalar constant for the proportional component of the PID control algorithm, $k_i$ is the value of the scalar constant for the integral component of the PID control algorithm, $k_d$ is the value of the scalar constant for the derivative component of the PID control algorithm, and e is the error calculated in EQN. 15.

In this embodiment of the invention, the controller 244 outputs a signal that is ultimately provided to the output conditioning module 232. The output conditioning module 232 controls operation of the voltage source 204 which in turn ultimately controls the power output by the power amplifier 212. By tuning three constants in the PID controller algorithm, the controller can provide control action designed for specific process requirements. The response of the controller can be described in terms of the responsiveness of the controller to an error, the degree to which the controller overshoots the setpoint and the degree of system oscillation. Alternative controller types (e.g., state-space controllers, adaptive controllers, fuzzy-logic controller) can be used in alternative embodiments of the invention.

The output ($V_{control}$) of the controller 244 is combined (e.g., summed) with a first feed-forward signal 272 with summing module 280b to produce a voltage setpoint signal ($V_{sp}$). The first feed-forward signal 272 is typically generated using a mathematical model of the desired operation of the system 200. In some embodiments, the first feed-forward signal 272 varies as a function of time (t). In some embodiments, the first feed-forward signal 272 is generated by an operator.

A summation module 280d calculates the difference between the voltage setpoint signal ($V_{sp}$) and the output of the A/D converter 236a. A/D converter 236a samples the output of the voltage source 204 and produces a digital version of the voltage source's 204 output ($V_{buck}$). Summation module 280d calculates the difference between the voltage setpoint signal ($V_{sp}$) and $V_{buck}$ based on the following:

$$e_v = V_{sp} - V_{buck}$$ EQN. 17

If the difference (error $e_v$) between the voltage setpoint signal ($V_{sp}$) and $V_{buck}$ is zero, the power amplifier 212 is providing the desired RF power signal to the load 224.

The RF power delivery system 200 also includes a second controller module 248 that receives the output of the summation module 180d (i.e., the difference between the voltage setpoint signal ($V_{sp}$) and $V_{buck}$)). The controller module 248 attempts to correct the error between a measured process variable (i.e., output of voltage source 204) and a desired setpoint (i.e., voltage setpoint $V_{sp}$) by calculating and then outputting a corrective action that can adjust the process accordingly.

In one embodiment, the controller module 248 is a proportional-integral-derivative (PID) controller module. The proportional value determines the reaction of the controller 248 to the current error, the intergal value determines the reaction of the controller 248 based on the sum of recent errors, and the derivative value determines the reaction of the controller 248 based on the rate at which the error has been changing. The weighted sum of these three actions is used to adjust the process via a control element based on the following:

$$I_{control} = k_{pv} e_v + k_{vi} \int e_v d\tau + k_{dv} \frac{de_v}{dt}$$ EQN. 18 where $k_{pv}$ is the value of the constant for the proportional component of the PID control algorithm, $k_{iv}$ is the value of the constant for the integral component of the PID control algorithm, $k_{dv}$ is the value of the constant for the derivative component of the PID control algorithm, and $e_v$ is the error determined with EQN. 17.

In this embodiment of the invention, the controller 248 outputs a signal that is ultimately provided to the output conditioning module 232. The output conditioning module 232 controls operation of the voltage source 204 which in turn ultimately controls the power output by the power amplifier 212. By tuning three constants in the PID controller algorithm, the controller can provide control action designed for specific process requirements. The response of the controller can be described in terms of the responsiveness of the controller to an error, the degree to which the controller overshoots the setpoint and the degree of system oscillation. Alternative controller types (e.g., state-space controllers, adaptive controllers, fuzzy-logic controller) can be used in alternative embodiments of the invention.

The output of the controller 248 is combined (e.g., summed) with a second feed-forward signal 276 with summing module 280a to produce a current setpoint signal ($I_{sp}$). The second feed-forward signal 276 is typically generated using a mathematical model of the desired operation of the system 200. In some embodiments, the second feed-forward signal 276 varies as a function of time (t). In some embodiments, the second feed-forward signal 276 is generated by an operator.

The current setpoint signal ($I_{sp}$) is provided to a digital to analog converter 240 which produces an analog signal version of the current setpoint signal ($I_{sp}$). The analog signal version of the of the current setpoint signal ($I_{sp}$) is provided to an analog circuit compensation network 228. The analog circuit compensation network 228 also receives a signal ($I_{meas}$) that is the measured current from the voltage source 204. In this embodiment, the analog circuit compensation network 228 is a lead-lag compensation network that increases the phase margin in the system and provides a signal to the output conditioning module 232. As discussed previously herein, the output conditioning module 232 provides a control signal (e.g., a pulse width modulated control signal) to the voltage source 204 that controls the output of the voltage source 204.

However, a buck delay adaptive control loop module 218 also affects the DC voltage signal 207 output by the voltage source 204. The buck delay adaptive control loop module 218 compensates for error $e_2$, which is determined using summation module 280e based on the following (with reference to FIGS. 2 and 3):

$$e_2 = P_{del\_end} - P_{del\_peak} \qquad \text{EQN. 19}$$

The error signal (pulse shape error $e_2$) is provided to the buck delay adaptive control loop module 218. The synchronization signal 288 also is provided to the buck delay adaptive control loop module 218. The control loop module 218 applies the following to compensate for a time delay ($\tau_{buck\_dlye}$):

$$\frac{d(\tau_{buck\_dlye})}{dt} = -k_{dly}(P_{del\_end} - P_{del\_peak}) \qquad \text{EQN. 20}$$

where $\tau_{buck\_dlye}$ is the time between the application of DC power to the voltage source 204 and delivery of the desired magnitude of RF power by the power amplifier 212, and $k_{dly}$ is a scalar constant chosen by an operator to achieve the desired power.

Figure 4:
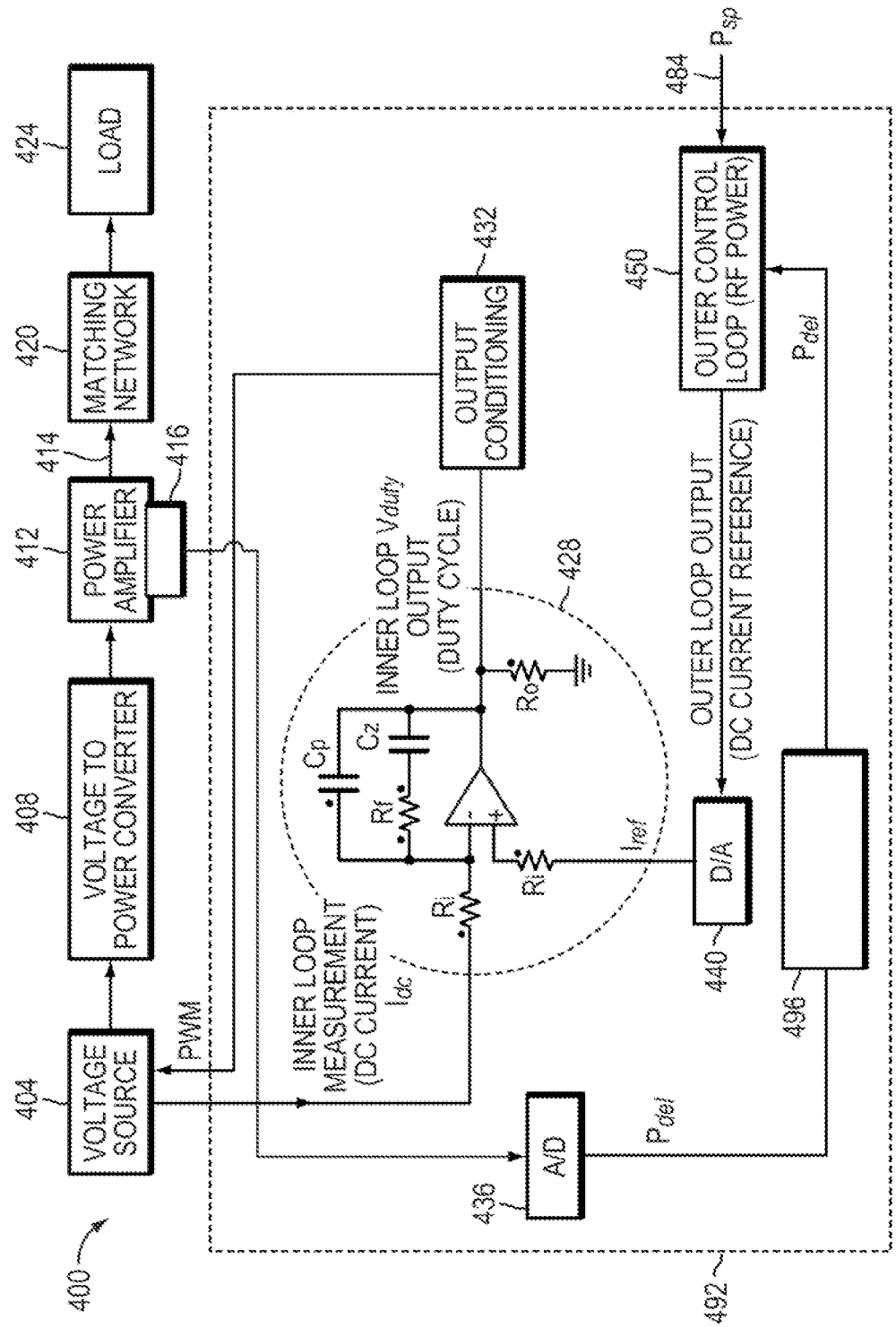
FIG. 4 is a schematic illustration of an RF power delivery system, according to an illustrative embodiment of the invention.

FIG. 4 is a schematic illustration of an RF power delivery system 400, according to an illustrative embodiment of the invention. The system 400 includes a voltage source 404 electrically coupled to a voltage to power converter 408. The voltage source 404 provides a voltage (e.g., a DC voltage) to the voltage to power converter 408. In some embodiments, the voltage source 404 is a buck regulator. The voltage to power converter 408 creates a DC power signal (e.g., a pulsed signal or a continuous wave signal) based on the voltage from the voltage source 404.

The voltage to power converter 408 is electrically coupled to a power amplifier 412 (e.g., an RF power amplifier). The voltage to power converter 408 provides the DC power signal to the power amplifier 412. The power amplifier 412 outputs an RF power signal 414 based on the DC power signal received from the voltage to power converter 408. The power amplifier 412 can output the RF power signal 414 with the same properties (e.g., pulses or continuous wave) as the properties of the DC power signal or with different properties. In some embodiments, the power amplifier 412 outputs an RF power signal 414 that is selected by an operator (or specified by a process controller) that is desired for load 424. In some embodiments, the power amplifier 412 outputs an RF power signal at frequencies between about 400 kHz and about 200 MHz. Typical RF Frequencies used in scientific, industrial and medical applications are approximately 2 MHz, 13.56 MHz, and 27 MHz.

The power amplifier 412 outputs the RF power signal to an optional matching network 420. The matching network 420 is used in some embodiments of the invention to match the impedance between the power amplifier 412 and the load 424. It is desirable to match the impedance between the power amplifier 412 and the load 424 to minimize the RF power that would otherwise be reflected back into the power amplifier from the load 424. The matching network 420 outputs a modified RF power signal in response to the RF power signal received from the power amplifier 412.

The modified RF power signal is provided to the load 424 (e.g., a plasma processing chamber used to process semiconductor wafers). In some embodiments, properties (e.g., impedance) of the load 424 vary during operation. Properties of the load 424 may vary based on changes in, for example, process conditions in a plasma chamber (e.g., gas flow rate, gas composition, and chamber pressure) and properties associated with the RF power delivered to the load (e.g., peak RF power, RF pulse frequency, RF pulse width/duty cycle).

The RF power delivery system 400 also includes a control system 492. The control system 492 includes an analog compensation network 428 electrically coupled to the voltage source 404 and an output conditioning module 432. The output conditioning module 432 provides a control signal (e.g., a pulse width modulated control signal) to the voltage source 404 that controls the output of the voltage source 404.

The control system 492 also includes an analog to digital (A/D) converter 436. The A/D converter 436 is electrically coupled to the output of a probe 416. The probe 416 is electrically coupled to the power amplifier 412 to measure properties (e.g., data for the RF power signal) of the RF power signal output by the power amplifier. In this embodiment, the probe 416 outputs the voltage signal ($V_{rf}$) and current signal ($I_{rf}$), which are measures of the RF power signal 414.

$V_{rf}$ and $I_{rf}$ have the following form:

$$V_{rf} = V_R + jV_I \qquad \text{EQN. 21}$$

$$I_{rf} = I_R + jI_I \qquad \text{EQN. 22}$$

where $V_R$ is the real component of the $V_{rf}$ signal, $V_I$ is the imaginary component of the $V_{rf}$ signal, $I_R$ is the real component of the $I_{rf}$ signal, $I_I$ is the imaginary component of the $I_{rf}$ signal.

In one embodiment, the voltage signal ($V_{rf}$) and the current signal ($I_{rf}$) output by the probe 416 are both sinusoidal signals. Exemplary probes 416 for use in different embodiments of the invention are the Model VI-Probe-4100 and VI-Probe-350 (MKS Instruments, Inc., Andover, Mass.). The A/D converter 436 samples the two signals ($V_{rf}$ and $I_{rf}$) and outputs digital signals [digital voltage signal ($V_{rf\text{-}dig}$) and digital current signal ($I_{rf\text{-}dig}$)]. The digital voltage signal ($V_{rf\text{-}dig}$) and digital current signal ($I_{rf\text{-}dig}$) are provided to a digital signal processing module 496 to produce a digital signal ($P_{del}$) that is the output power of the power amplifier 412.

An operator or processor (not shown) provides a power setpoint signal 484 ($P_{sp}$) to the RF power delivery system 400 which is the RF power signal desired to be provided to the load 424. In some embodiments, a mathematical model of the desired operation of the system is implemented on the processor to produce the power setpoint signal 484.

The RF power delivery system 400 also includes a first controller module 450 that receives the $P_{del}$ signal (from processing module 496) and the $P_{sp}$ signal (484). The controller module 450 attempts to correct the error between a measured process variable (i.e., output of processing module 496) and the desired setpoint (P_sp 484) by calculating and then outputting a corrective action that can adjust the process accordingly. The controller module 450 outputs a DC current reference signal to a D/A converter 440. The D/A converter outputs an analog DC current reference signal ($I_{ref}$) to an analog compendation network 428. The voltage source 404 provides a signal to the analog compensation network 428 that is the DC current ($I_{oc}$) in the voltage source 404. The analog compensation network 428 outputs a duty cycle signal $V_{duty}$ to an output conditioning module 432 based on the DC current ($I_{oc}$) and the DC current reference signal ($I_{ref}$). The output conditioning module 432 outputs a PWM signal to the voltage source 404.

In one embodiment, the controller module 450 is a proportional-integral-derivative (PID) controller module, similarly as previously described herein with respect to, for example FIGS. 1 and 2. The proportional value determines the reaction of the controller 450 to the current error, the integral value determines the reaction of the controller 450 based on the sum of recent errors, and the derivative value determines the reaction of the controller 450 based on the rate at which the error has been changing. The weighted sum of these three actions is used to adjust the process via a control element. The output conditioning module 432 controls operation of the voltage source 404 which in turn ultimately controls the power output by the power amplifier 412. By tuning three constants in the PID controller algorithm, the controller can provide control action designed for specific process requirements. The response of the controller can be described in terms of the responsiveness of the controller to an error, the degree to which the controller overshoots the setpoint and the degree of system oscillation. Alternative controller types (e.g., state-space controllers, adaptive controllers, fuzzy-logic controller) can be used in alternative embodiments of the invention.

Figure 5A:
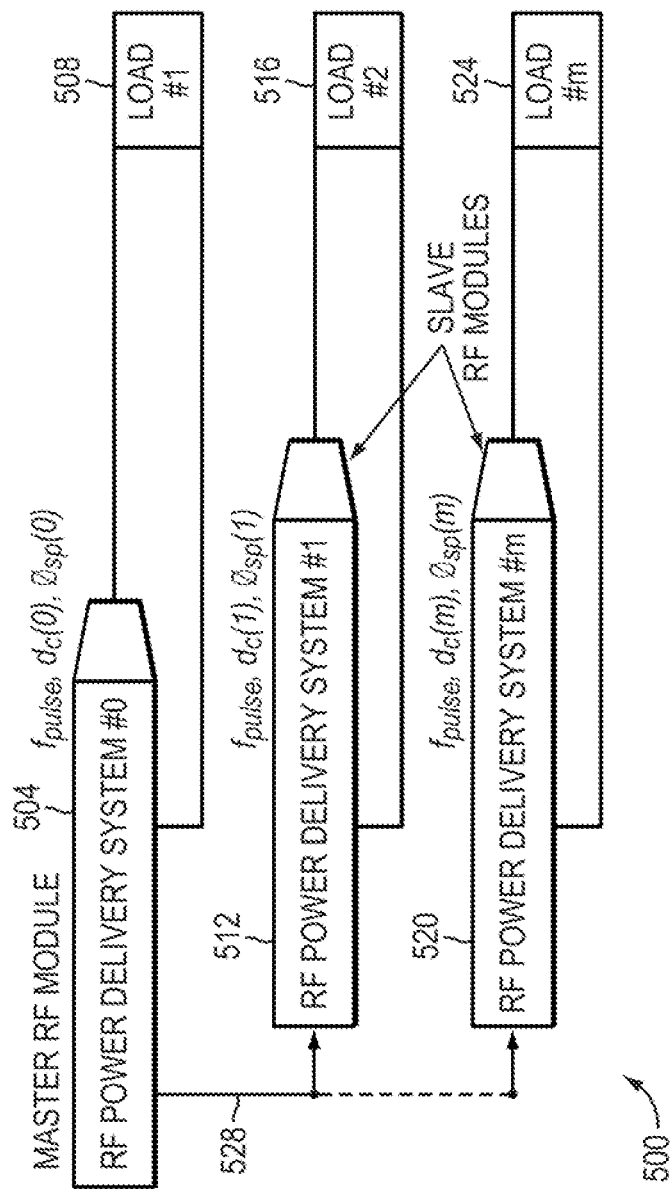
FIG. 5A is a schematic illustration of a master-slave RF power delivery system, according to an illustrative embodiment of the invention.

FIG. 5A is a schematic illustration of a master-slave RF power delivery system 500, according to an illustrative embodiment of the invention. The system 500 includes a master power delivery system 504 (e.g., RF power delivery system 100 or 200 of FIGS. 1 and 2, respectively) that generates RF power that is provided to load 508. The system 500 also includes a plurality (m) of slave power delivery systems (e.g., a plurality of RF power delivery systems 100 or 200 of FIGS. 1 and 2, respectively), each coupled to the master power delivery system 504.

Figure 5B:
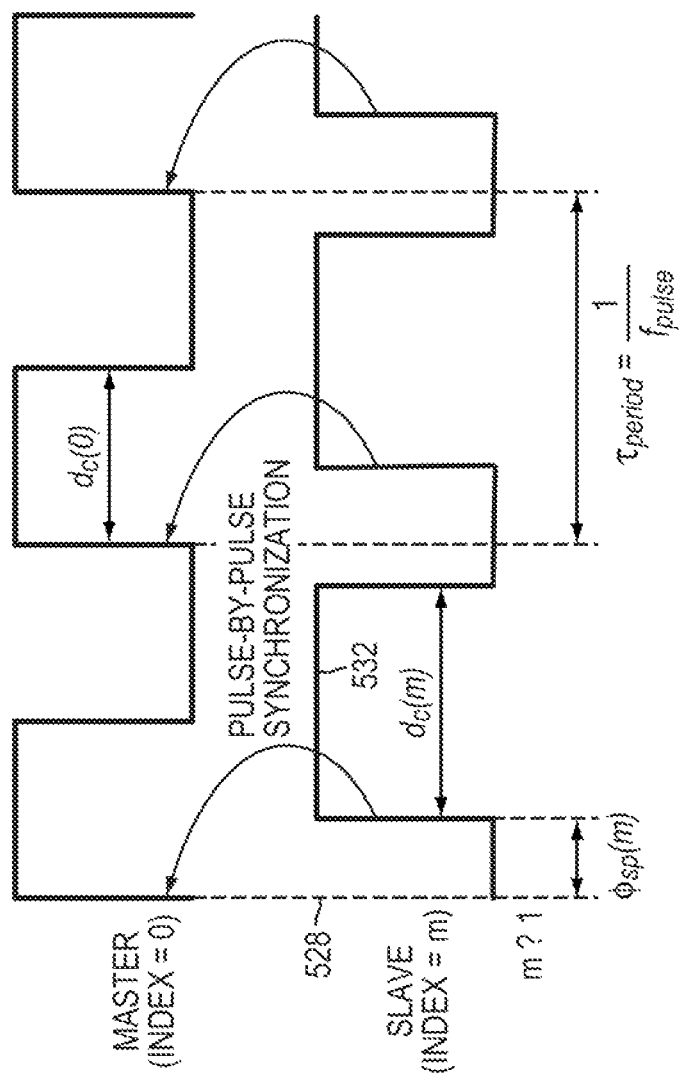
FIG. 5B is a graphical representation of synchronization of the slave RF power delivery system of FIG. 5A to the master RF power delivery system of FIG. 5A, according to an illustrative embodiment of the invention.

FIG. 5A depicts a first slave power supply 512 that generates an RF power signal that is provided to load 516. FIG. 5A also depicts power delivery system #m (520) that provides RF power to load 524. FIG. 5B is a graphical representation of synchronization of power delivery system #m (520) to the master power delivery system 504. The master power delivery system 504 generates a synchronizing pulse signal 528 (referring to FIG. 5A) that is provided to each of the (m) power delivery systems. The synchronizing pulse signal 528 (e.g., the synchronization signal 188 of FIG. 1 and the synchronization signal 288 of FIG. 2) is correlated to the frequency ($f_{pulse}$) of the pulses power output by the master power delivery system 504 to the load 508. The system 500 applies a time delay $\phi_{sp(m)}$ to the synchronizing pulse signal 528 and triggers the slave power delivery system 520 to generate a slave pulsed power 532 to be generated by the slave power delivery system 520, thereby synchronizing the slave pulsed power 532 with the synchronizing pulse signal 528. The phase shift for each slave power delivery system is individually set/programmed by an operator. In some embodiments, the phase shift is the same for each slave power delivery system. The index m denotes the number of RF generator slave power delivery systems are connected to the master RF generator 504. The pulsing duty cycle (dc(m)) is set by an operator and is often determined based on the load and desired operating conditions of the system.

Figure 6A:
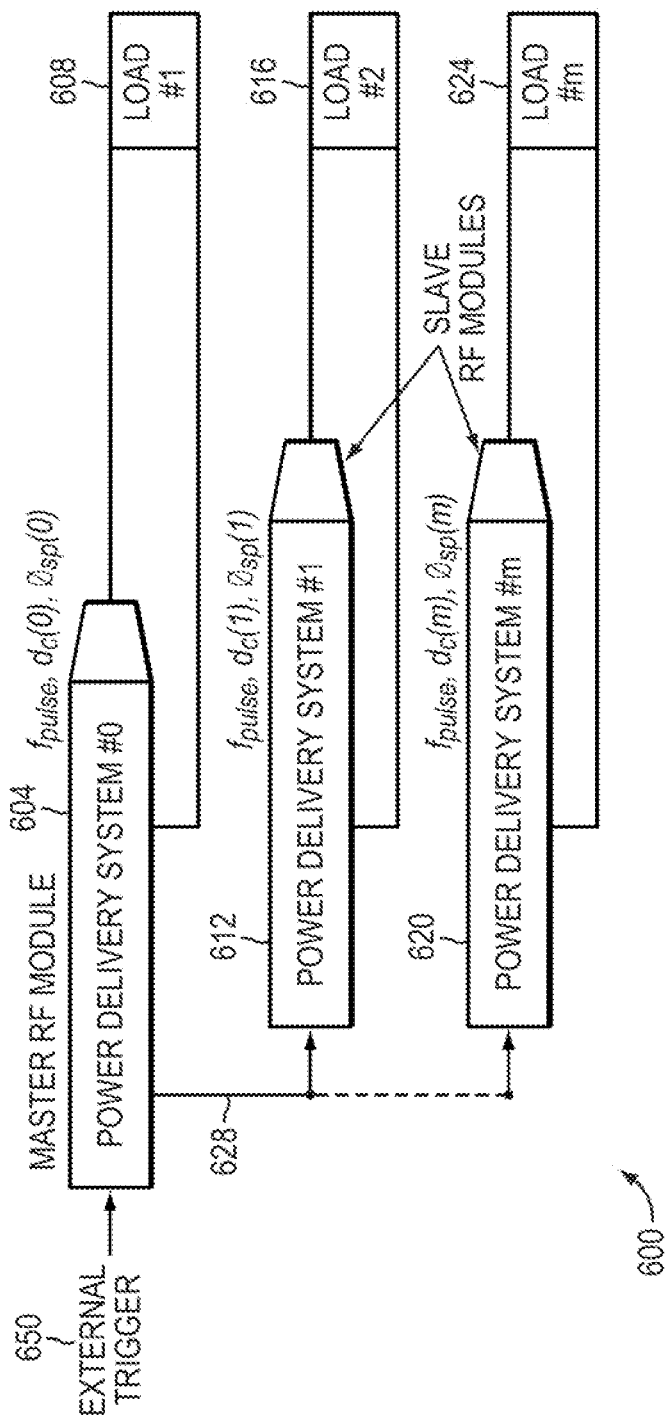
FIG. 6A is a schematic illustration of a master-slave RF power delivery system with an external trigger, according to an illustrative embodiment of the invention.

FIG. 6A is a schematic illustration of a master-slave RF power delivery system 600, according to an illustrative embodiment of the invention. The system 600 includes a master power delivery system 604 (e.g., RF power delivery system 100 or 200 of FIGS. 1 and 2, respectively) that generates RF power that is provided to load 608. The system 600 also includes a plurality (m) of slave power delivery systems (e.g., a plurality of RF power delivery systems 100 or 200 of FIGS. 1 and 2, respectively), each coupled to the master power delivery system 604.

Figure 6B:
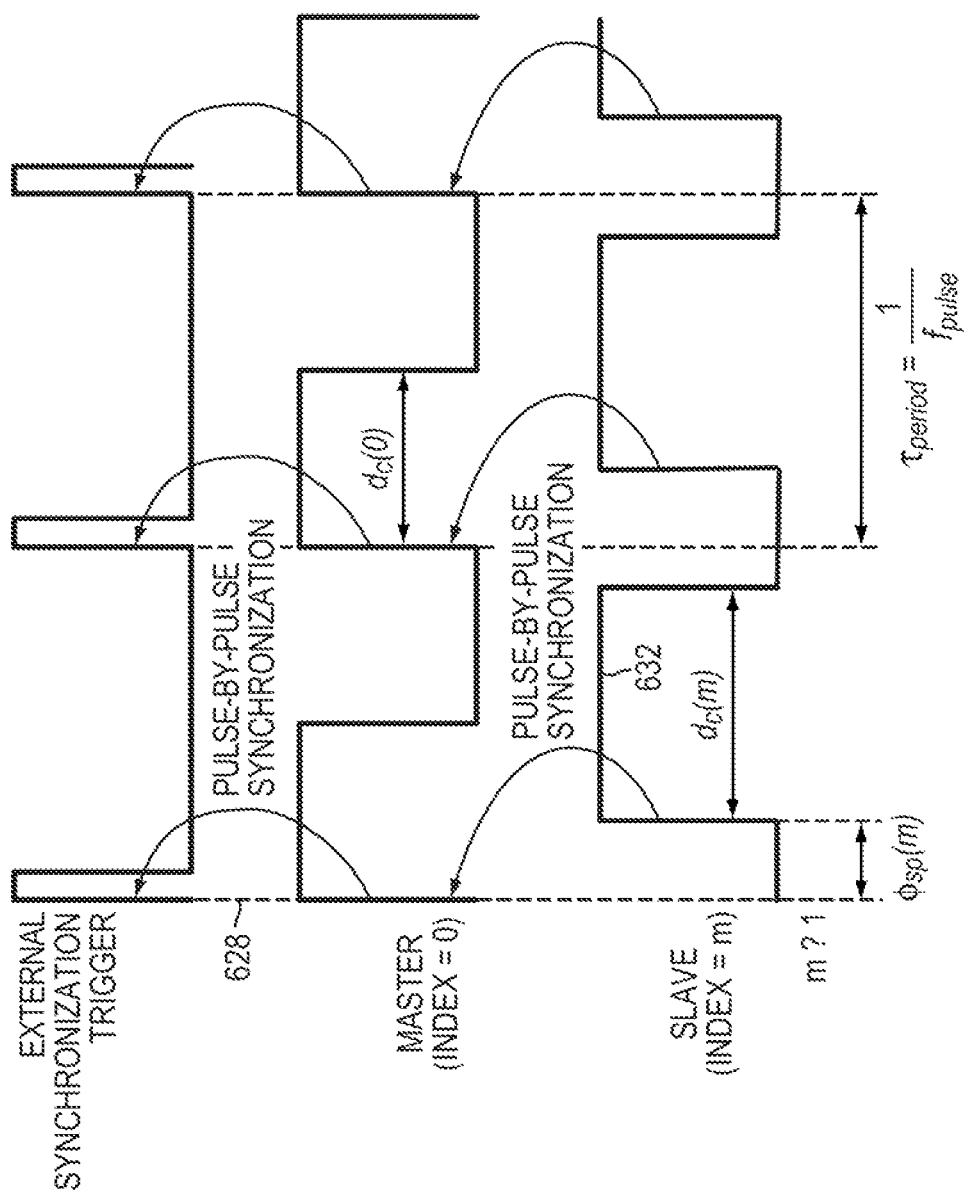
FIG. 6B is a graphical representation of synchronization of the slave RF power delivery system of FIG. 6A to the master RF power delivery system of FIG. 6A, according to an illustrative embodiment of the invention.

FIG. 6A depicts a first slave power supply 612 that generates an RF power signal that is provided to load 616. FIG. 6A also depicts power delivery system #m (620) that provides RF power to load 624. FIG. 6B is a graphical representation of synchronization of power delivery system #m (620) to the master power delivery system 604. An external synchronization trigger (e.g., pulse train) signal 628 is provided to the master power delivery system 604 by, for example, an external signal generator that is in electrical communication with the master power delivery system. The external synchronization trigger signal 628 is provided to each of the (m) power delivery systems. The master power delivery system 604 generates an RF power signal and delivers the RF power signal to the load 608 based on the external synchronization trigger signal 628. Each of the (m) slave power delivery systems generate RF power signals and deliver the RF power signals to respective loads based on the external synchronization trigger signal 628. The system 600 applies a time delay $\phi_{sp(m)}$ to the synchronizing pulse signal 628 and triggers the slave power delivery system 620 to generate a slave pulsed power 632 to be generated by the slave power delivery system 620, thereby synchronizing the slave pulsed power 632 with the synchronizing pulse signal 628. The index m denotes the number of RF generator slave power delivery systems are connected to the master RF generator 604. The pulsing duty cycle (dc(m)) is set by an operator and is often determined based on the load and desired operating conditions of the system.

FIG. 6C is a graphical representation of an alternative method for synchronization of power delivery system #m (620) to the master power delivery system 604. The alternative method involves a single trigger signal that is used to trigger the power delivery systems to output RF power to their respective loads. The external synchronization trigger signal 628 is provided to the master power delivery system 604 by, for example, an external trigger source. The external synchronization trigger signal 628 is provided to each of the (m) power delivery systems. The master power delivery system 604 generates an RF power signal and delivers the RF power signal to the load 608 based on the external synchronization trigger signal 628. Each of the (m) slave power delivery systems generate RF power signals and deliver the RF power signals to respective loads based on the external synchronization trigger signal 628. The system 600 applies a time delay $\phi_{sp(m)}$ to the synchronizing pulse signal 628 and triggers the slave power delivery system 620 to generate a slave pulsed power 632 to be generated by the slave power delivery system 620, thereby synchronizing the slave pulsed power 632 with the synchronizing pulse signal 628.

Figure 7:
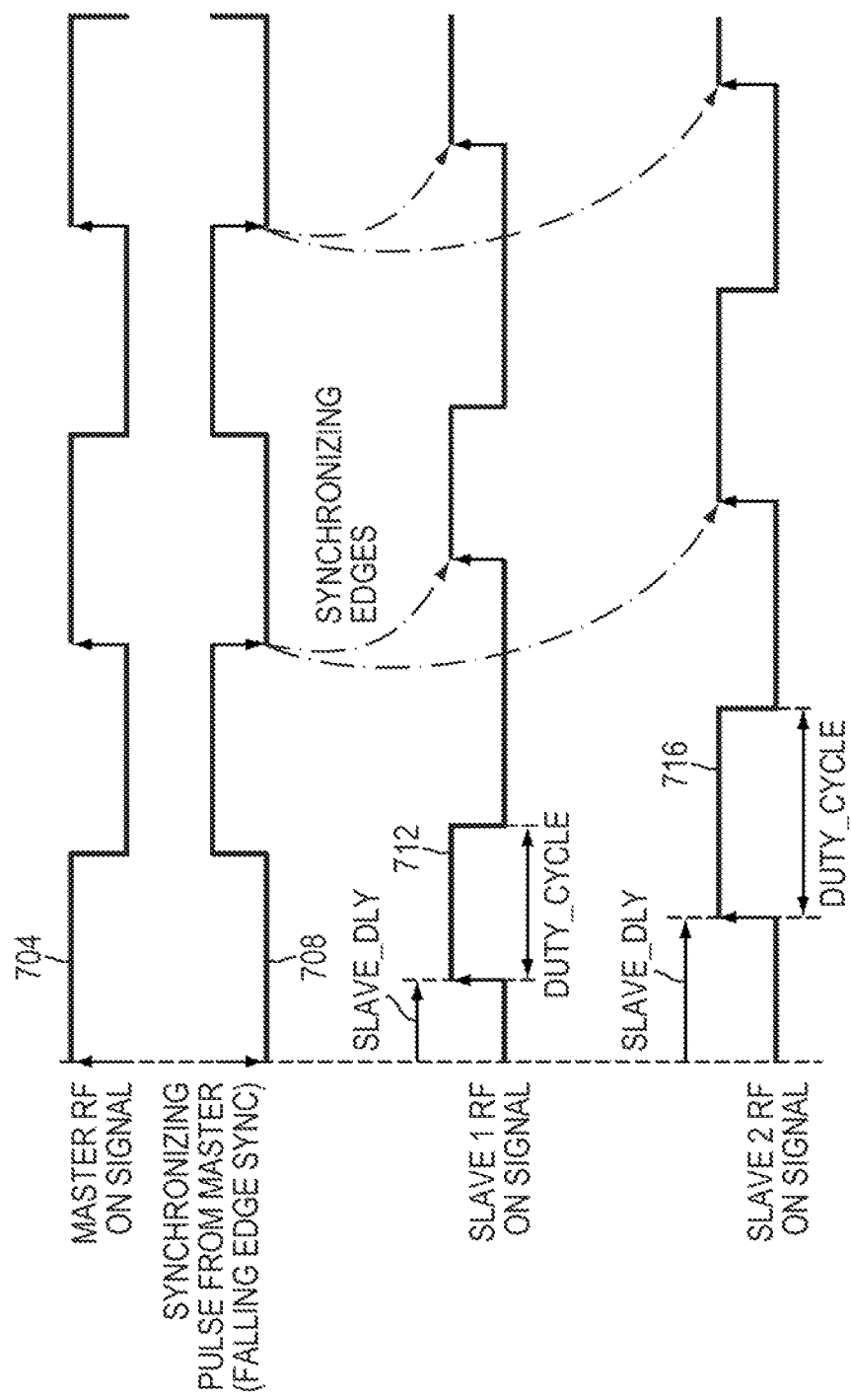
FIG. 7 is a graphical illustration of synchronizing pulses in a master-slave RF power delivery system, according to an illustrative embodiment of the invention.

FIG. 7 is a graphical illustration of synchronizing pulses in a master-slave RF power delivery system, according to an illustrative embodiment of the invention. In this embodiment, signal 704 is the RF power signal generated by a master power delivery system (e.g., RF power delivery system 504 of FIG. 5A). The RF power system generates a synchronization signal 708 based on the RF power signal 704. In this embodiment, the synchronization signal 708 is the inverse of the RF power delivery signal 704. The synchronization signal 708 is delivered to a first and second slave power delivery system. The first slave power delivery system generates an RF power signal 712 having a time delay (slave_dly) and duty cycle that is specific for the first slave power delivery system. The second slave power delivery system generates an RF power signal 716 having a time delay (slave_dly) and duty cycle that is specific for the second slave power delivery system. The time delay and duty cycle for one slave power delivery system can be, but is not required to be, the same as the time delay and duty cycle of any other slave power delivery system.

In some embodiments, synchronizing a slave power delivery system to a synchronization signal includes calculating a second frequency for the slave power delivery system based on the frequency of the synchronization signal. In some embodiments, calculating the second frequency includes measuring the time period between a falling edge of and rising edge of the synchronization signal.

Embodiments of the invention described herein are useful in providing power to a plasma load having variable load impedance. Embodiments of the invention are capable of stabilizing a plasma over a wide range of plasma conditions, including, for example, rapid changes in plasma gas species, rapid changes in plasma gas pressure and/or flow rate, and rapid changes in delivered power levels during plasma processing, without the onset of plasma instability or plasma drop out (i.e., loss of plasma ignition).

The plasma processing capabilities achieved using various embodiments of the invention are valuable in commercial plasma processing applications because they allow for faster plasma process transitions. Faster plasma process transitions result in an increase in the throughput (and thereby lower cost) of the process. The plasma processing capabilities also provide a benefit to the manufacturing yield and process capability in plasma applications by improving the plasma process control (e.g., process property repeatability within a specific workpiece or between workpieces over time).

The technologies described herein and the plasma processing capability provided, as described above, provides increased process throughput (e.g., lower cost per workpiece) and improved process control (e.g., higher yield) in a variety of industrial and commercial applications, including: Plasma etch or reactive ion etch (RIE) of films or substrates in semiconductor manufacturing, solar cell manufacturing, or other plasma etch industrial applications; Plasma-enhanced chemical vapor deposition (PECVD) of films in semiconductor manufacturing, solar cell manufacturing, or other PECVD industrial applications; Ionized physical vapor deposition (iPVD) of films in semiconductor manufacturing, solar cell manufacturing, or other iPVD industrial applications; and Atomic layer deposition (ALD) of films in semiconductor manufacturing, solar cell manufacturing, or other ALD industrial applications.

In some embodiments, the technologies described herein provide a user with the capability to pulse the RF power at high frequency and provides for flexible synchronization of the source and bias RF power pulsing (e.g., flexible settings of relative pulse timing and duty cycle). The technologies described herein and the plasma processing capability provided enable, for example, continuous, independent variation of several important plasma parameters (including electron density and temperature, ion density and temperature, positive and negative ion fractions, etc.), which would allow more flexible optimization of plasma processes than is available with purely CW RF power, without physical modification to the inside of the plasma processing chamber.

The technologies described herein and the plasma processing capability provided also enable extended pressure/power operating regimes (not available with pure CW RF operation), higher etch and deposition rates with lower average RF power, reduced heat flux and charging of workpiece, and independent adjustment of important plasma chemistry components.

The technologies described herein and the plasma processing capability provided provide lower electron temperature with approximately unchanged average plasma density, which allows reduction of electron bombardment, charging, and damage (such as "notching", "micro-trenching", or "etch pits") to devices on substrates (workpieces), without reducing throughput in plasma processing.

The technologies described herein and the plasma processing capability provided also provide improved etch selectivity (differences in etch rate between the target film and the etch mask, sub-layers under the target film, or other materials exposed to the process) and anisotropy (the control of vertical sidewall angles in high aspect ratio structures) by improving the adhesion of blocking polymers to vertical sidewalls and bottoms of structures during the off-pulse period and enabling independent control of the energy and number of ions bombarding the substrate during the on-pulse period. This reduces the lateral etch rate by ions during the on-pulse period and improves etch selectivity between different materials on the workpiece, providing improved etch control in a variety of applications, such as gate etch, trench etch, and metal etch plasma processes.

The technologies described herein and the plasma processing capability provided also provide higher thin film deposition rate and improved film materials properties in PECVD and ionized PVD (iPVD) processes by independent control of electron energy & temperature, average ion energy, ion energy distribution (IED), total ion flux, and reduced heat flux to the substrate.

With increasing workpiece sizes (e.g., wafer diameter in semiconductor fabrication, panel area in solar cell fabrication), achieving or maintaining desirable uniformity across the workpiece of etch rate and deposition rate in plasma processes is becoming more challenging. Furthermore, the etch rate, etch selectivity, anisotropy, the incidental electron charging/damage (such as "notching" and "micro-trenching"), and the heat flux to the substrate are becoming more and more difficult to simultaneously optimize. In particular, adequate aspect ratio control across the workpiece, especially with high aspect ratio structures, is becoming increasingly difficult to achieve. RF pulsing, especially flexible synchronized pulsing of the RF source and RF bias generators, is well-known to enable independent, simultaneous optimization of these conflicting plasma process requirements. For example synchronized source-bias pulsing is known to eliminate two important problems in etch processes, notching/micro-trenching damage and ARDE (Aspect Ratio Dependant Etching). Furthermore, it has been reported that, with high frequency pulsing, the etch rate with very large area substrates (glass panels) can be more than doubled while reducing the substrate process temperature to less than 1200 C, relative to continuous RF processing.

Accordingly, it is therefore desirable to provide a user with the capability to pulse the RF power at high frequency and also provide flexible synchronization of the source and bias RF power pulsing. Technologies described herein provide such improved plasma processing control and are useful in various industrial and commercial applications, including, for example: Plasma etch or reactive ion etch (RIE) of films or substrates in semiconductor manufacturing, solar cell manufacturing, or other plasma etch industrial applications; Plasma-enhanced chemical vapor deposition (PECVD) of films in semiconductor manufacturing, solar cell manufacturing, or other PECVD industrial applications; Ionized physical vapor deposition (iPVD) of films in semiconductor manufacturing, solar cell manufacturing, or other iPVD industrial applications; and Atomic layer deposition (ALD) of films in semiconductor manufacturing, solar cell manufacturing, or other ALD industrial applications.

In some embodiments, the technology described herein provides the capability to apply dual frequency RF bias power (i.e., adjustable amounts of power from either of two different RF generators with different frequencies) to a workpiece in a plasma process. The technologies described herein and the plasma processing capability provided enable flexible, independent adjustment of average energy of the ion energy distribution (IED) in the plasma (by controlling the total combined power of the two bias frequencies) and the width of the IED (by adjustment of the ratio of the power applied from each of the two frequencies). This technique enables orthogonal control of these two important parameters, independent of the plasma density, which is controlled by the source RF power & frequency, and the process gas pressure & flow settings. The technologies described herein and the plasma processing capability provided also provide improved control of polymer deposition, etch rate & selectivity, etch profile, and etch CD control through flexible adjustment of average ion energy and ion energy distribution width.

The capability to independently control average ion energy and the width of the IED would provide improved plasma processing control in, for example, the following industrial and commercial applications: Plasma etch or reactive ion etch (RIE) of films or substrates in semiconductor manufacturing, solar cell manufacturing, or other plasma etch industrial applications; Plasma-enhanced chemical vapor deposition (PECVD) of films in semiconductor manufacturing, solar cell manufacturing, or other PECVD industrial applications; Ionized physical vapor deposition (iPVD) of films in semiconductor manufacturing, solar cell manufacturing, or other iPVD industrial applications; and Atomic layer deposition (ALD) of films in semiconductor manufacturing, solar cell manufacturing, or other ALD industrial applications.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

The invention claimed is:

1. A method of power delivery, comprising:
    delivering power from a power delivery system in a continuous-wave mode to a load;
    generating a signal in a feedback loop to control the delivered power, the signal correlated to a power control algorithm; and
    adjusting a single variable in the power control algorithm to transition the delivered power from the continuous-wave mode to a pulsed mode.

2. The method of claim 1 further comprising activating a switch in the feedback loop based on an input corresponding to the single variable, the switch in electrical communication with a power amplifier.

3. The method of claim 1 further comprising filtering the signal in the feedback loop to provide a substantially stable power measurement.

4. The method of claim 1 further comprising providing the signal as an input to a voltage source, the voltage source providing a voltage to a voltage to power converter.

5. The method of claim 4 wherein the signal is a duty cycle input of the voltage source.

6. The method of claim 1 further comprising calculating a power offset between a power set point and the delivered power.

7. The method of claim 1 further comprising measuring the delivered power to obtain data.

8. The method of claim 7 further comprising generating a second signal to adjust a shape of delivered pulsed power, the second signal correlated to the data to minimize an amplitude difference between a peak of a pulse and a substantially stable portion of the pulse.

9. The method of claim 8 further comprising correlating the second signal to a time delay measured between a voltage source receiving a set point and a voltage to power converter outputting power.

10. The method of claim 7 further comprising correlating the signal to the data to minimize a power difference between a power set point and a substantially stable portion of a pulse.

* * * * *